(12) United States Patent
Park et al.

(10) Patent No.: US 12,713,904 B2
(45) Date of Patent: Aug. 18, 2026

(54) SEMICONDUCTOR DEVICE AND ELECTRONIC SYSTEM INCLUDING THE SAME

(71) Applicant: SAMSUNG ELECTRONICS CO., LTD., Suwon-si (KR)

(72) Inventors: Sujin Park, Suwon-si (KR); Hongsoo Kim, Suwon-si (KR); Hee-Sung Kam, Suwon-si (KR); Byungjoo Go, Suwon-si (KR); Janghee Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 444 days.

(21) Appl. No.: 18/533,031

(22) Filed: Dec. 7, 2023

(65) Prior Publication Data

US 2025/0149443 A1 May 8, 2025

(30) Foreign Application Priority Data

Apr. 11, 2023 (KR) ........................ 10-2023-0047465

(51) Int. Cl.
*H10B 41/10* (2023.01)
*H10B 41/27* (2023.01)
(Continued)

(52) U.S. Cl.
CPC .......... *H10W 20/435* (2026.01); *H10B 41/10* (2023.02); *H10B 41/27* (2023.02); *H10B 41/35* (2023.02); *H10B 41/41* (2023.02); *H10B 43/10* (2023.02); *H10B 43/27* (2023.02); *H10B 43/35* (2023.02); *H10B 43/40* (2023.02); *H10B 80/00* (2023.02); *H10W 20/42* (2026.01); *H10W 90/00* (2026.01); *H10W 90/752* (2026.01)

(58) Field of Classification Search
CPC .............. H10B 41/10–41; H10B 41/50; H10B 43/10–50; G11C 5/06
See application file for complete search history.

(56) References Cited

U.S. PATENT DOCUMENTS 7,781,335 B2 8/2010 Isono
8,987,907 B2 3/2015 Kang et al.
(Continued)

FOREIGN PATENT DOCUMENTS

CN 111312719 A 6/2020

*Primary Examiner* — Thanhha S Pham
(74) *Attorney, Agent, or Firm* — Morgan, Lewis & Bockius LLP

(57) ABSTRACT

A semiconductor device may include a source structure including a cell region and an extension region adjacent to the cell region, a gate stack in the cell and extension regions, a penetration contact disposed in the extension region, a stepwise insulating layer disposed on the gate, and an interconnection structure on the stepwise insulating layer. The interconnection structure may include a first interconnection insulating layer, a first lower conductive pattern in the first interconnection insulating layer, a capping layer on the first interconnection insulating layer, and a via structure penetrating the capping layer. The via structure may include a plurality of first vias connected to the first lower conductive pattern and connected to an upper conductive pattern, and the first vias may be disposed in the extension region.

20 Claims, 17 Drawing Sheets

(51) Int. Cl.

| | |
|---|---|
| ***H10B 41/35*** | (2023.01) |
| ***H10B 41/41*** | (2023.01) |
| ***H10B 43/10*** | (2023.01) |
| ***H10B 43/27*** | (2023.01) |
| ***H10B 43/35*** | (2023.01) |
| ***H10B 43/40*** | (2023.01) |
| ***H10B 80/00*** | (2023.01) |
| ***H10W 20/41*** | (2026.01) |
| ***H10W 20/42*** | (2026.01) |
| ***H10W 90/00*** | (2026.01) |

(56) References Cited

U.S. PATENT DOCUMENTS

| | | | | |
|---|---|---|---|---|
| 9,991,126 | B2 | 6/2018 | Park et al. | |
| 10,354,980 | B1 | 7/2019 | Mushiga et al. | |
| 10,748,923 | B2 | 8/2020 | Son et al. | |
| 11,152,277 | B2 | 10/2021 | Liu | |
| 11,217,523 | B2 | 1/2022 | Lee | |
| 11,244,719 | B2 | 2/2022 | Lee | |
| 11,362,104 | B2 | 6/2022 | Kang et al. | |
| 2021/0193672 | A1 | 6/2021 | Kim et al. | |
| 2021/0407968 | A1 | 12/2021 | Kim et al. | |
| 2022/0013426 | A1 | 1/2022 | Liu | |
| 2022/0102370 | A1* | 3/2022 | Kwon .................... | H10B 43/50 |

* cited by examiner

GST2
GST1
SST
PST
189
187
183
IP
CP
SL3
SL2
SL1
111
100
A'
163 162
CS
CIP
CC 167 TC
170
320
STE
SP2
DTE
DL3
DL2
SP1
DL1
107
105
101
103
CR
SR
ER
NR
DR
A
120
192
191
DIP1
DIP2
DSL
DDL3
DDL2
DDL1
DT2
DT1
D1
D2
D3

SEMICONDUCTOR DEVICE AND ELECTRONIC SYSTEM INCLUDING THE SAME

CROSS-REFERENCE TO RELATED APPLICATIONS

This application claims priority under 35 U.S.C. § 119 to Korean Patent Application No. 10-2023-0047465, filed on Apr. 11, 2023, in the Korean Intellectual Property Office, the entire contents of which are hereby incorporated by reference in their entirety.

TECHNICAL FIELD

The present disclosure relates to a semiconductor device and an electronic system including the same, and more particularly to a semiconductor device including a plurality of vias and an electronic system including the same.

DISCUSSION OF RELATED ART

Due to their small-sized, multifunctional, and/or low-cost characteristics, semiconductor devices may be regarded as important elements in the electronics industry. The semiconductor devices may be classified into semiconductor memory devices for storing data, semiconductor logic devices for processing data, or hybrid semiconductor devices including both of memory and logic elements.

With the trend toward high speed and low power consumption of electronic devices, development of semiconductor devices in the electronic devices may lead to high operating speeds and/or low operating voltages. The development of the semiconductor device may include increasing an integration density of the semiconductor device. However, as the integration density of the semiconductor device increases, the semiconductor device may suffer from deterioration in electrical characteristics and production yield.

SUMMARY

An embodiment of the inventive concept provides a semiconductor device with improved electrical and reliability characteristics and an electronic system including the same.

According to an embodiment of the inventive concept, a semiconductor device may include a source structure including a cell region and an extension region adjacent to the cell region, a gate stack in the cell region and the extension region, a penetration contact disposed in the extension region, a stepwise insulating layer disposed on the gate stack, and an interconnection structure on the stepwise insulating layer. The interconnection structure may include a first interconnection insulating layer, a first lower conductive pattern in the first interconnection insulating layer, a capping layer on the first interconnection insulating layer, and a via structure penetrating the capping layer. The via structure may include a plurality of first vias connected to the first lower conductive pattern and connected to an upper conductive pattern, and the plurality of first vias may be disposed in the extension region.

According to an embodiment of the inventive concept, a semiconductor device may include a source structure including a cell region, a dummy region, and an extension region between the cell region and the dummy region, a gate stack in the cell region and the extension region, a dummy stack in the dummy region, a stepwise insulating layer disposed in the gate stack and the dummy stack, and an interconnection structure on the stepwise insulating layer. The interconnection structure may include a first interconnection insulating layer, a first lower conductive pattern in the first interconnection insulating layer, a capping layer on the first interconnection insulating layer, a second interconnection insulating layer on the capping layer, and a via structure penetrating the second interconnection insulating layer. The via structure may include a plurality of first vias in the dummy region and connected between the first lower conductive pattern and an upper conductive pattern. The dummy stack may include first dummy insulating patterns and second dummy insulating patterns, which are alternatively stacked.

According to an embodiment of the inventive concept, an electronic system may include a substrate, a semiconductor device on the substrate, and a controller provided on the substrate and electrically connected to the semiconductor device. The semiconductor device may include an insulating layer on the substrate, a peripheral transistor disposed between the substrate and the insulating layer, a source structure on the insulating layer, the source structure including a cell region, a dummy region, and an extension region between the cell region and the dummy region, a gate stack in the cell region and the extension region, a dummy stack in the dummy region, a memory channel structure penetrating the gate stack, a penetration contact and a connection contact disposed in the extension region, a stepwise insulating layer disposed on the gate stack and the dummy stack, and an interconnection structure on the stepwise insulating layer. The dummy stack may include first dummy insulating patterns and second dummy insulating patterns, which are alternatively stacked. The interconnection structure may include a first interconnection insulating layer, a first lower conductive pattern in the first interconnection insulating layer, a second lower conductive pattern in the first interconnection insulating layer, a capping layer on the first interconnection insulating layer, a second interconnection insulating layer on the capping layer, and a via structure penetrating the second interconnection insulating layer and the capping layer. The via structure may include a plurality of first vias connected to the first lower conductive pattern and the upper conductive pattern, and a plurality of second vias, which are connected to the second lower conductive pattern and the upper conductive pattern. The first lower conductive pattern and the plurality of first vias may be in the extension region, and the second lower conductive pattern and the plurality of second vias may be in the dummy region.

BRIEF DESCRIPTION OF THE DRAWINGS

FIG. 1B is a perspective view schematically illustrating an electronic system including a semiconductor device, according to an embodiment of the inventive concept.

FIG. 2A is a plan view illustrating a semiconductor device according to an embodiment of the inventive concept.

FIG. 8 is a sectional view illustrating a semiconductor device according to an embodiment of the inventive concept.

FIG. 9 is a sectional view illustrating a semiconductor device according to an embodiment of the inventive concept.

DETAILED DESCRIPTION

Example embodiments of the inventive concepts will now be described more fully with reference to the accompanying drawings, in which example embodiments are shown.

Figure 1A:
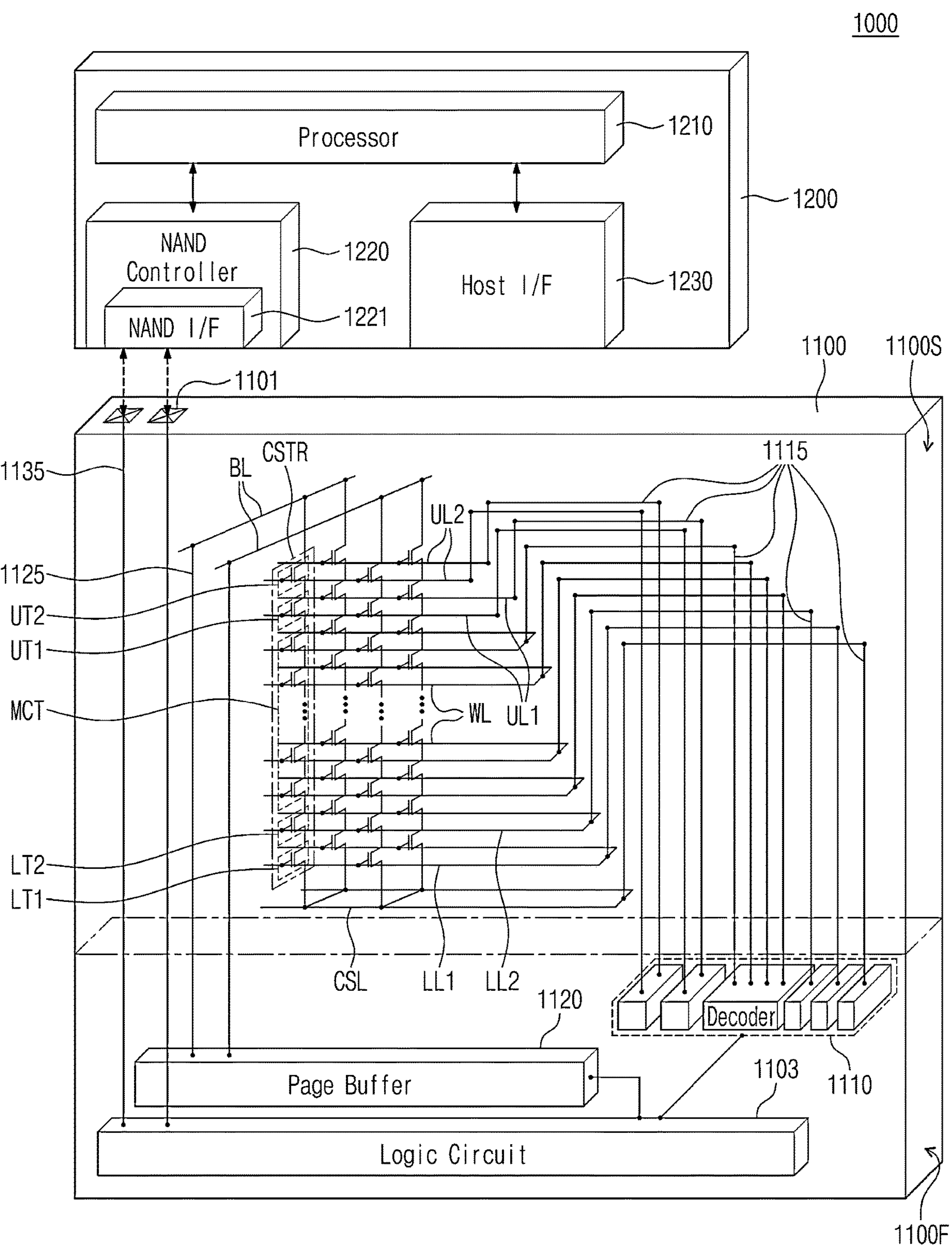
FIG. 1A is a schematic diagram illustrating an electronic system including a semiconductor device, according to an embodiment of the inventive concept.

FIG. 1A is a schematic diagram illustrating an electronic system including a semiconductor device according to an embodiment of the inventive concept.

Referring to FIG. 1A, an electronic system 1000 according to an embodiment of the inventive concept may include a semiconductor device 1100 and a controller 1200. The semiconductor device 1100 and the controller 1200 may be electrically connected to each other. The electronic system 1000 may be a storage device including one or more semiconductor devices 1100 or an electronic device including the storage device. For example, the electronic system 1000 may be a solid state drive (SSD) device, a universal serial bus (USB), a computing system, a medical system, or a communication system, in which at least one semiconductor device 1100 is provided.

The semiconductor device 1100 may be a nonvolatile memory device and may be, for example, a NAND flash memory device. The semiconductor device 1100 may include a first structure 1100F and a second structure 1100S. The second structure 1100S may be formed on the first structure 1100F. In an embodiment, the first structure 1100F may be disposed beside the second structure 1100S. The first structure 1100F may be a peripheral circuit structure, which may include a decoder circuit 1110, a page buffer 1120, and a logic circuit 1103. The second structure 1100S may be a memory cell structure, which may include a bit line BL, a common source line CSL, word lines WL, first gate upper lines UL1 and second gate upper lines UL2, first gate lower lines LL1 and second gate lower lines LL2, and memory cell strings CSTR between the bit line BL and the common source line CSL.

In the second structure 1100S, the memory cell strings CSTR may be electrically connected between the bit line BL and the common source line CSL. Each of the memory cell strings CSTR may include lower transistors LT1 and LT2, which may be adjacent to the common source line CSL, upper transistors UT1 and UT2, which may be adjacent to the bit line BL, and a plurality of memory cell transistors MCT, which may be disposed between the lower transistors LT1 and LT2 and the upper transistors UT1 and UT2. The number of the lower transistors LT1 and LT2 and the number of the upper transistors UT1 and UT2 may be variously changed, according to embodiments.

In an embodiment, the upper transistors UT1 and UT2 may include a string selection transistor, and the lower transistors LT1 and LT2 may include a ground selection transistor. The gate lower lines LL1 and LL2 may be respectively used as gate electrodes of the lower transistors LT1 and LT2. The word lines WL may be used as gate electrodes of the memory cell transistors MCT, respectively. The gate upper lines UL1 and UL2 may be used as gate electrodes of the upper transistors UT1 and UT2, respectively.

The common source line CSL, the first and second gate lower lines LL1 and LL2, the word lines WL, and the first and second gate upper lines UL1 and UL2 may be electrically connected to the decoder circuit 1110 through first connection lines 1115. The first connection lines 1115 may extend from the first structure 1100F into the second structure 1100S. The bit lines BL may be electrically connected to the page buffer 1120 through second connection lines 1125. The second connection lines 1125 may extend from the first structure 1100F into the second structure 1100S.

In the first structure 1100F, the decoder circuit 1110 and the page buffer 1120 may be configured to perform a control operation on at least one of the memory cell transistors MCT. The decoder circuit 1110 and the page buffer 1120 may be controlled by the logic circuit 1103. The semiconductor device 1100 may communicate with the controller 1200 through an input/output pad 1101. The input/output pad 1101 may be electrically connected to the logic circuit 1103. The input/output pad 1101 may be electrically connected to the logic circuit 1103 through an input/output connection line 1135. The input/output connection line 1135 may extend from the first structure 1100F to the second structure 1100S.

The controller 1200 may include a processor 1210, a NAND controller 1220, and a host interface 1230. In an embodiment, the electronic system 1000 may include a plurality of semiconductor devices 1100, and in this case, the controller 1200 may be configured to control the semiconductor devices 1100.

The processor 1210 may control operations of the electronic system 1000 including operations of the controller 1200. The processor 1210 may be operated based on a specific firmware and may control the NAND controller 1220 to access the semiconductor device 1100. The NAND controller 1220 may include a NAND interface 1221, which may be used for communication with the semiconductor device 1100. The NAND interface 1221 may be used to transmit and receive control commands to control the semiconductor device 1100, data to be written in, or read from, the memory cell transistors MCT of the semiconductor device 1100, and so forth. The host interface 1230 may be configured to allow for communication between the electronic system 1000 and an external host. When a control command is received from the external host through the host interface 1230, the processor 1210 may control the semiconductor device 1100 in response to the control command.

Figure 1B:
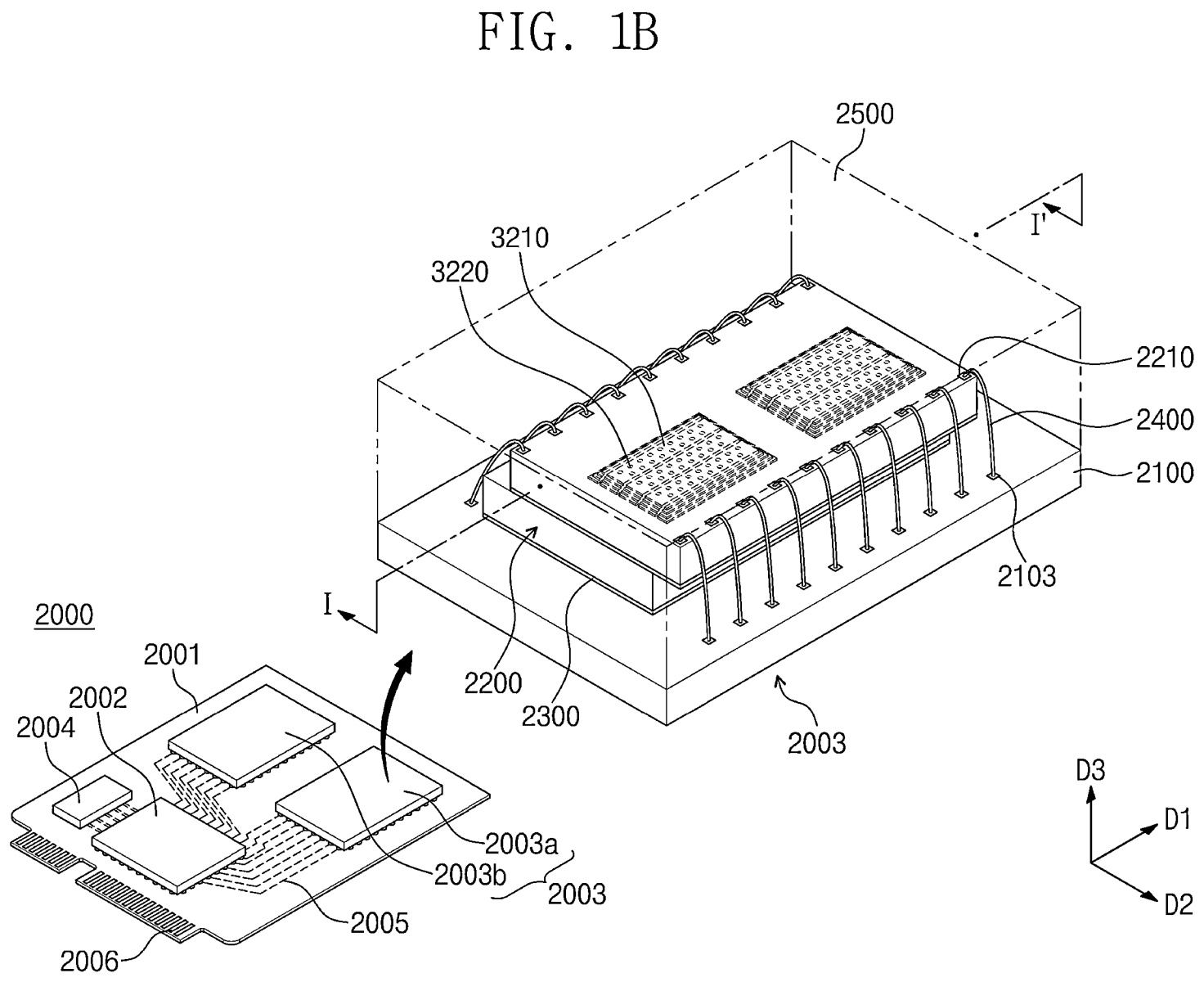

FIG. 1B is a perspective view schematically illustrating an electronic system including a semiconductor device according to an embodiment of the inventive concept.

Referring to FIG. 1B, an electronic system 2000 according to an embodiment of the inventive concept may include a main substrate 2001, a controller 2002, one or more semiconductor packages 2003, and a DRAM 2004. The controller 2002, the one or more semiconductor packages 2003, and the DRAM 2004 may be mounted on the main substrate 2001. The semiconductor package 2003 and the DRAM 2004 may be connected to the controller 2002, and to each other, by interconnection patterns 2005. The interconnection patterns 2005 may be formed in the main substrate 2001.

The main substrate 2001 may include a connector 2006, which may include a plurality of pins coupled to an external host. In the connector 2006, the number and arrangement of the pins may depend on a communication interface between the electronic system 2000 and the external host. In an embodiment, the electronic system 2000 may communicate with the external host, in accordance with one of interfaces, such as universal serial bus (USB), peripheral component interconnect express (PCI-Express), serial advanced technology attachment (SATA), universal flash storage (UFS) M-PHY, or the like. In an embodiment, the electronic system 2000 may be driven by an electric power, which may be supplied from the external host through the connector 2006. The electronic system 2000 may further include a power management integrated circuit (PMIC) configured to distribute power. The power may be supplied from the external host, and may be supplied to the controller 2002 and the semiconductor package 2003.

The controller 2002 may be configured to control a writing operation or reading operation on the semiconductor package 2003, and to improve an operation speed of the electronic system 2000.

The DRAM 2004 may be a buffer memory configured to relieve technical difficulties caused by a difference in speed between the semiconductor package 2003 and an external host. The semiconductor package 2003 may server as a data storage device. In an embodiment, the DRAM 2004 in the electronic system 2000 may serve as a cache memory and may be used as a storage space, which may be used to temporarily store data during a control operation on the semiconductor package 2003. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include a first semiconductor package 2003*a* and a second semiconductor package 2003*b*. The first semiconductor package 2003*a* and the second semiconductor package 2003*b* may be spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, the semiconductor chips 2200 on the package substrate 2100, adhesive layers 2300, which may be respectively disposed in bottom surfaces of the semiconductor chips 2200, a connection structure 2400, which may electrically connect the semiconductor chips 2200 to the package substrate 2100, and a molding layer 2500, which may be provided on the package substrate 2100. The molding layer 2500 may be formed on the semiconductor chips 2200 and the connection structure 2400. The molding layer 2500 may be encapsulate the semiconductor chips 2200 and the connection structure 2400.

The package substrate 2100 may be a printed circuit board, which may include package upper pads 2103. Each of the semiconductor chips 2200 may include an input/output pad 2210. The input/output pad 2210 may correspond to the input/output pad 1101 of FIG. 1A. Each of the semiconductor chips 2200 may include gate stacks 3210 and memory channel structures 3220. Each of the semiconductor chips 2200 may include a semiconductor device.

In an embodiment, the connection structure 2400 may be bonding wires electrically connecting the input/output pad 2210 to the package upper pads 2103. Thus, in each of the first and second semiconductor packages 2003*a* and 2003*b*, the semiconductor chips 2200 may be electrically connected to each other in a bonding wire manner and may be electrically connected to the package upper pads 2103 of the package substrate 2100. Alternatively, in each of the first and second semiconductor packages 2003*a* and 2003*b*, the semiconductor chips 2200 may be electrically connected to each other by a connection structure including through-silicon vias (TSVs). In this case, the semiconductor chips 2200 may not be electrically connected by the connection structure 2400 provided in the form of bonding wires. For example, the connection structure 2400 provided in the form of bonding wires may be omitted.

In an embodiment, the controller 2002 and the semiconductor chips 2200 may be included in a single package. In an embodiment, the controller 2002 and the semiconductor chips 2200 may be mounted on an additional interposer substrate different from the main substrate 2001 and may be connected to each other through interconnection lines, which may be provided in the interposer substrate.

Figure 1C:
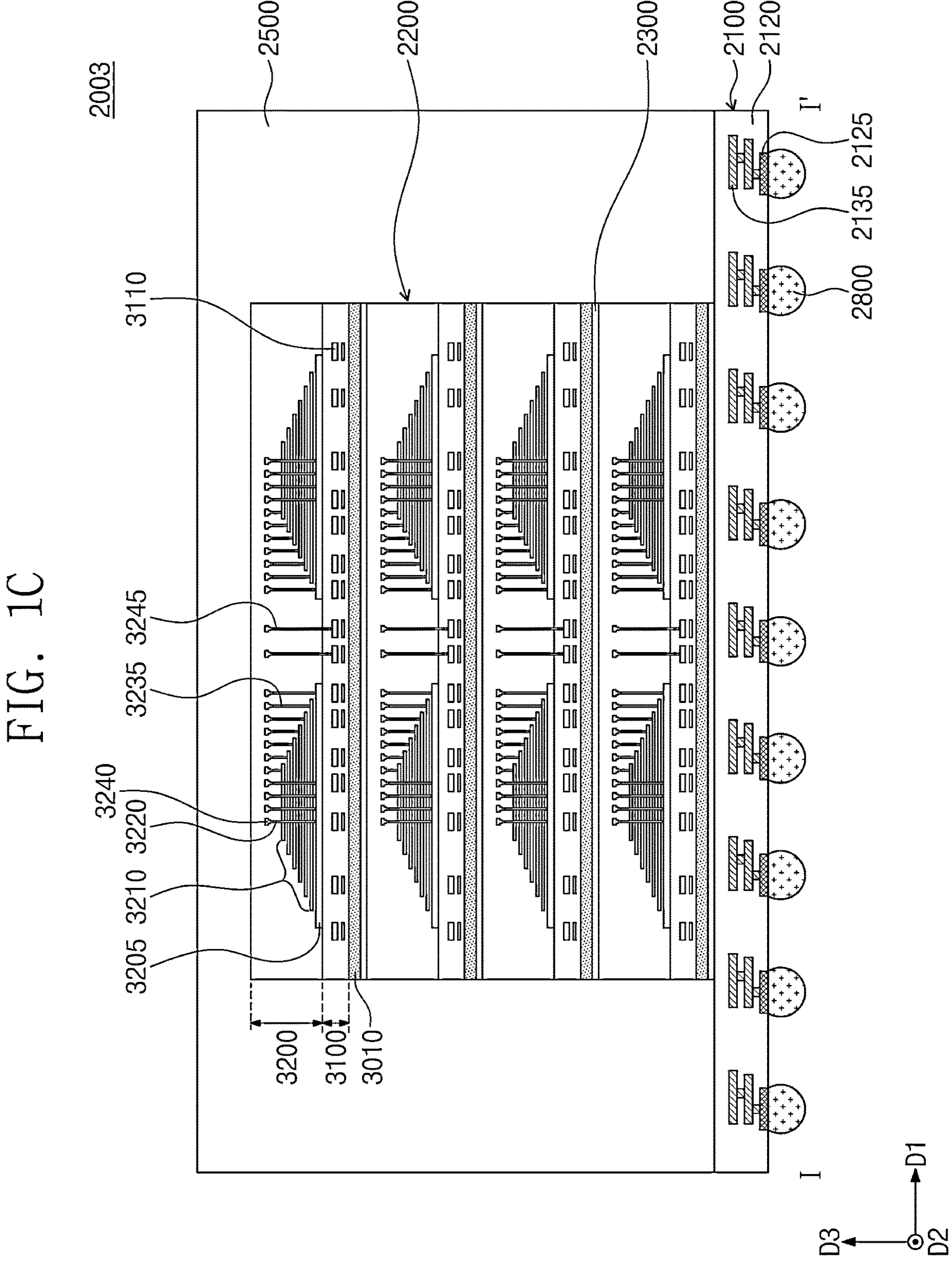
FIG. 1C and FIG. 1D are sectional views, each of which schematically illustrates a semiconductor package according to an embodiment of the inventive concept.
Figure 1D:
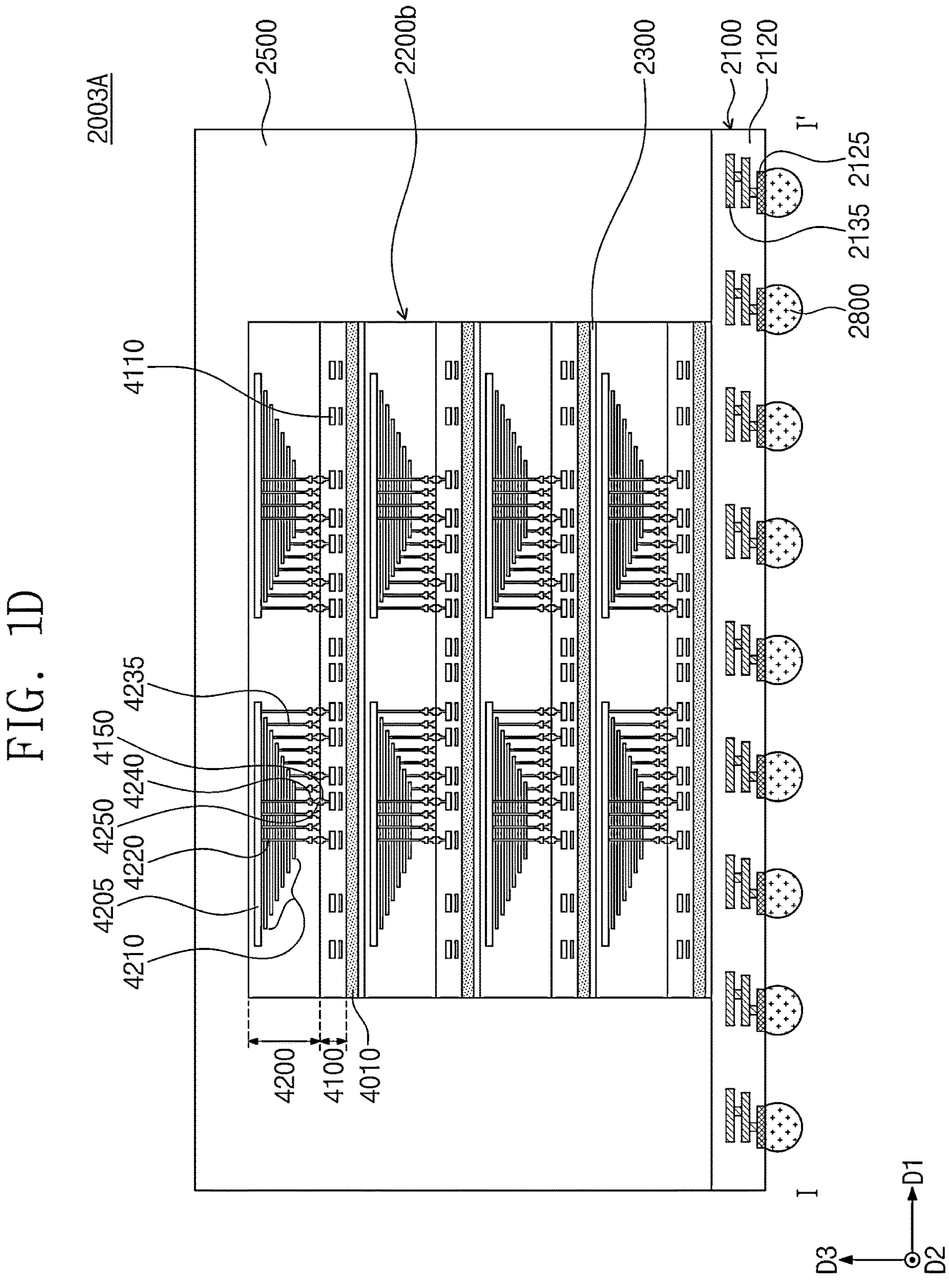

FIG. 1C and FIG. 1D are sectional views, each of which schematically illustrates a semiconductor package according to an embodiment of the inventive concept. Each of FIG. 1C and FIG. 1D schematically illustrates an example of the semiconductor package 2003 of FIG. 1B taken along a line I-I' of FIG. 1B.

Referring to FIG. 1C, in the semiconductor package 2003, the package substrate 2100 may be a printed circuit board. The package substrate 2100 may include a package substrate body portion 2120, package upper pads 2103 (e.g., of FIG. 1B) disposed on a top surface of the package substrate body portion 2120, lower pads 2125 disposed on, or exposed through, a bottom surface of the package substrate body portion 2120, and internal lines 2135 provided in the package substrate body portion 2120. The internal lines 2135 may electrically connect the package upper pads 2103 to the lower pads 2125. The package upper pads 2103 may be electrically connected to the connection structures 2400 (e.g., of FIG. 1B). The lower pads 2125 may be connected to the interconnection patterns 2005 of the main substrate 2001 of the electronic system 2000, which is shown in FIG. 1B, through conductive connecting portions 2800.

Each of the semiconductor chips 2200 may include a semiconductor substrate 3010 and a first structure 3100 and a second structure 3200. The first structure 3100 and the second structure 3200 may be sequentially stacked on the semiconductor substrate 3010. The first structure 3100 may be disposed on the semiconductor substrate 3010 and the second structure 3200 may be disposed on the first structure 3100. The first structure 3100 may include a peripheral circuit region provided with peripheral lines 3110. The second structure 3200 may include a common source line 3205, a gate stack 3210 on the common source line 3205, the memory channel structures 3220, which may penetrate the gate stack 3210, bit lines 3240, which may be electrically connected to the memory channel structures 3220, and gate contact plugs 3235, which may be electrically connected to the word lines WL (e.g., see FIG. 1A) of the gate stack 3210.

Each of the semiconductor chips 2200 may be electrically connected to the peripheral lines 3110 of the first structure 3100 and may include a penetration line 3245. The penetration line 3245 may extend into the second structure 3200. The penetration line 3245 may be disposed outside the gate stack 3210. In an embodiment, the penetration line 3245 may penetrate the gate stack 3210. Each of the semiconductor chips 2200 may further include the input/output pad 2210 of FIG. 1B.

Referring to FIG. 1D, in a first semiconductor package 2003A, each of semiconductor chips 2200*a* may include a semiconductor substrate 4010, a first structure 4100 on the semiconductor substrate 4010, and a second structure 4200, which is disposed on the first structure 4100 and is bonded to the first structure 4100 by a wafer bonding method.

The first structure 4100 may include a peripheral circuit region, in which a peripheral line 4110 and first junction structures 4150 may be provided. The second structure 4200 may include a common source line 4205, a gate stack 4210 between the common source line 4205 and the first structure 4100, memory channel structures 4220, bit lines 4240 electrically connected to the memory channel structures 4220, gate contact plugs 4235, and second junction structures 4250. The memory channel structures 4220 may penetrate the gate stack 4210. The gate contact plugs 4235 may be electrically connected to the word lines WL of FIG. 1A of the gate stack 4210, respectively. For example, the second junction structures 4250 may be electrically connected to the memory channel structures 4220, respectively, through the bit lines 4240, which may be electrically connected to the memory channel structures 4220. The first junction structures 4150 of the first structure 4100 and the second junction structures 4250 of the second structure 4200 may be bonded to each other. In an embodiment, bonding portions of the first junction structures 4150 and the second junction structures 4250 may be formed of copper (Cu). Each of the semiconductor chips 2200*b* may further include the input/output pad 2210 of FIG. 1B.

The semiconductor chips 2200 of FIG. 1C and the semiconductor chips 2200*b* of FIG. 1D may be electrically connected to each other by the connection structures 2400 of FIG. 1B, which are provided in the form of bonding wires. However, in an embodiment, semiconductor chips, which may be provided in the same semiconductor package as the semiconductor chips 2200 of FIG. 1C or the semiconductor chips 2200*b* of FIG. 1D, may be electrically connected to each other through a connection structure including the through-silicon vias (TSVs).

Figure 2A:
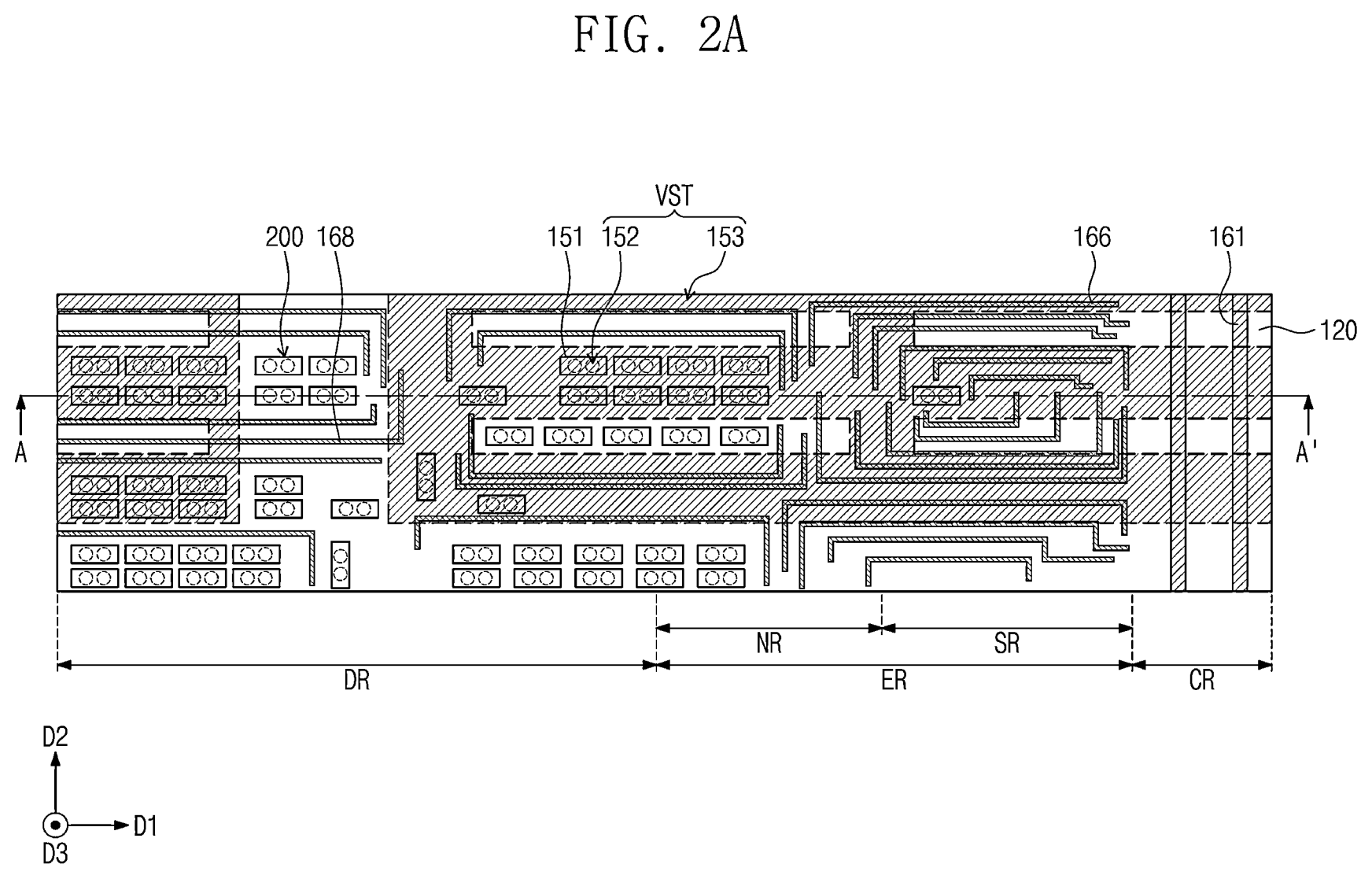
Figure 2B:
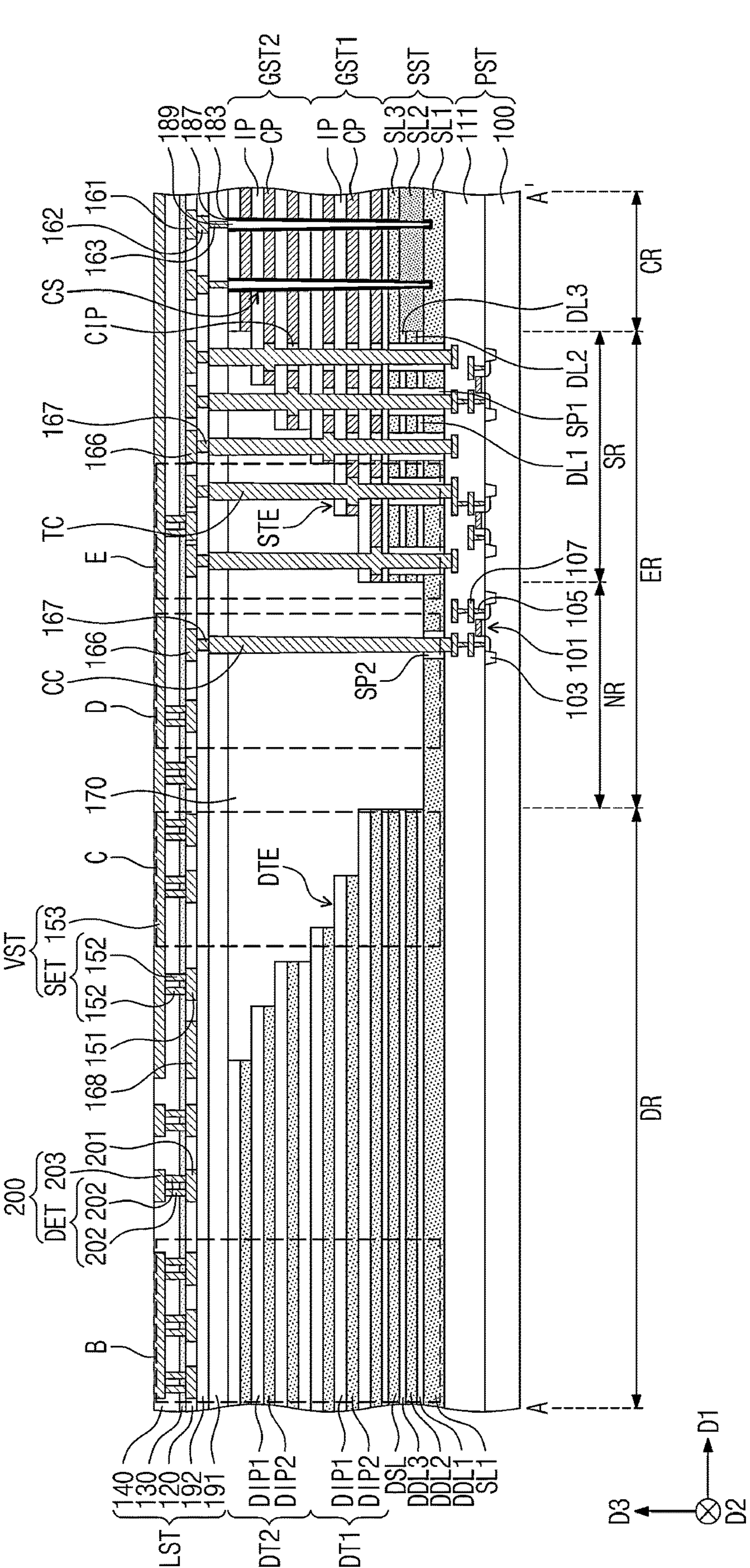
FIG. 2B is a sectional view taken along a line A-A' of FIG. 2A.
Figure 2C:
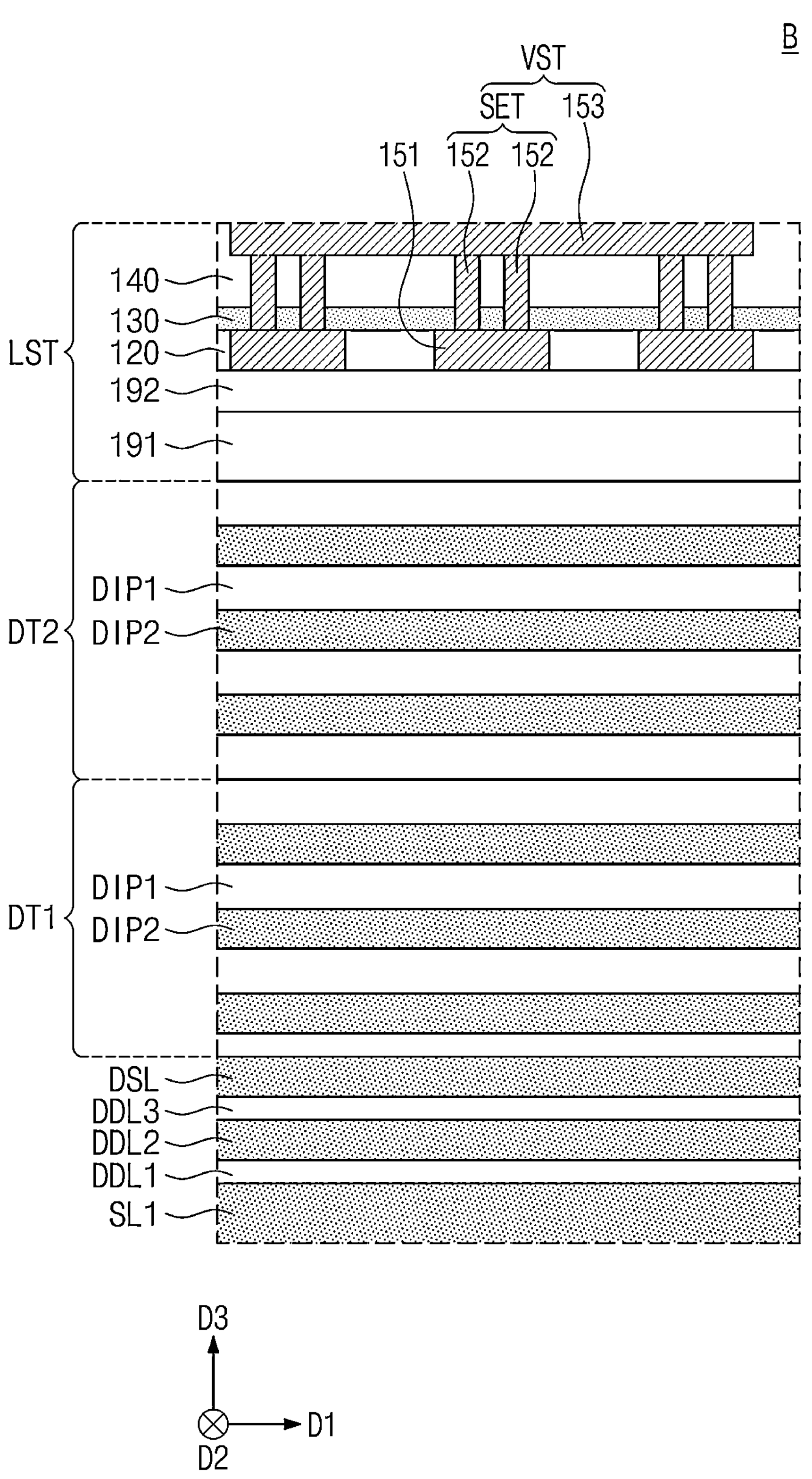
FIG. 2C is an enlarged sectional view illustrating a portion 'B' of FIG. 2B.
Figure 2D:
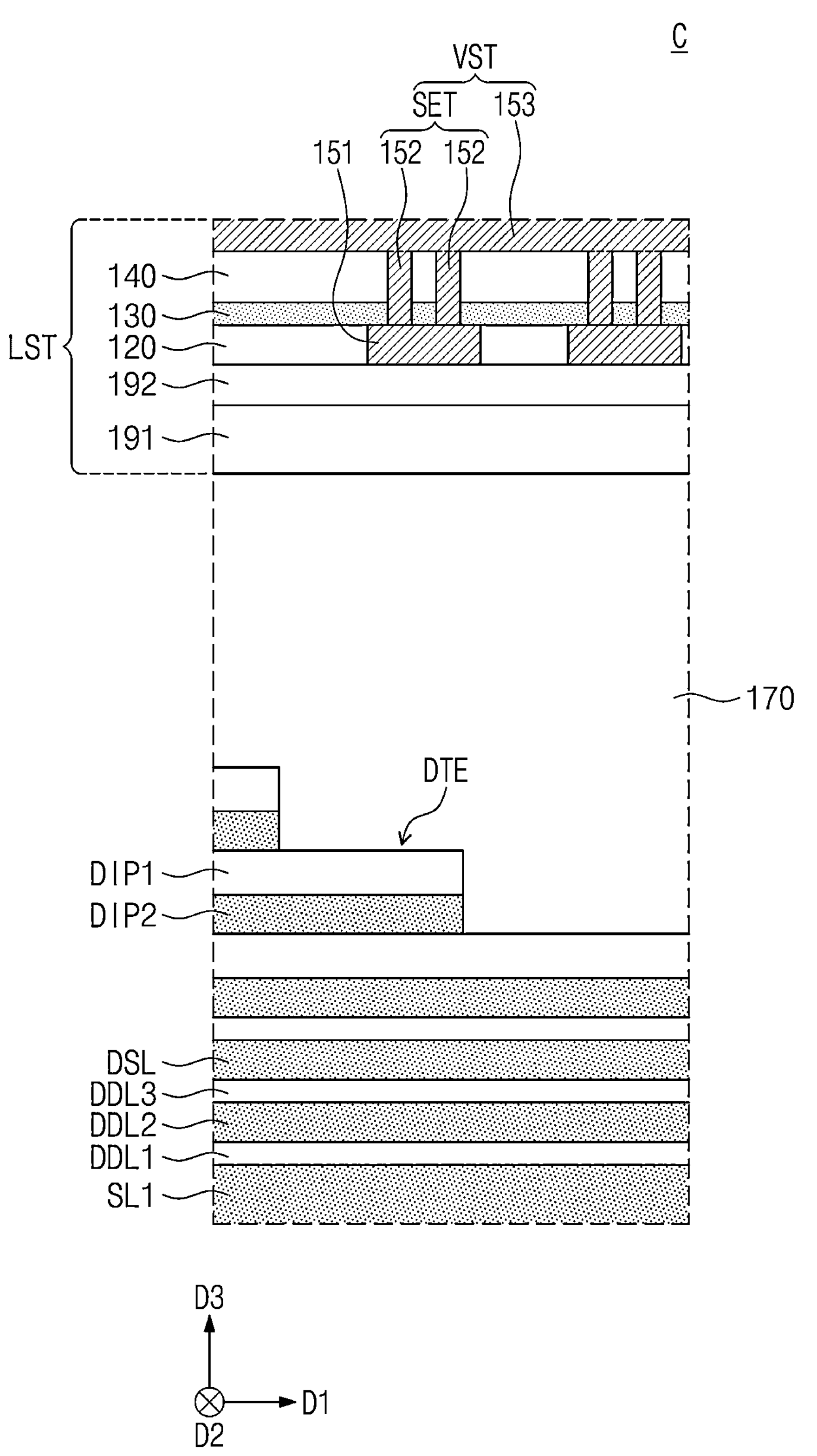
FIG. 2D is an enlarged sectional view illustrating a portion 'C' of FIG. 2B.
Figure 2E:
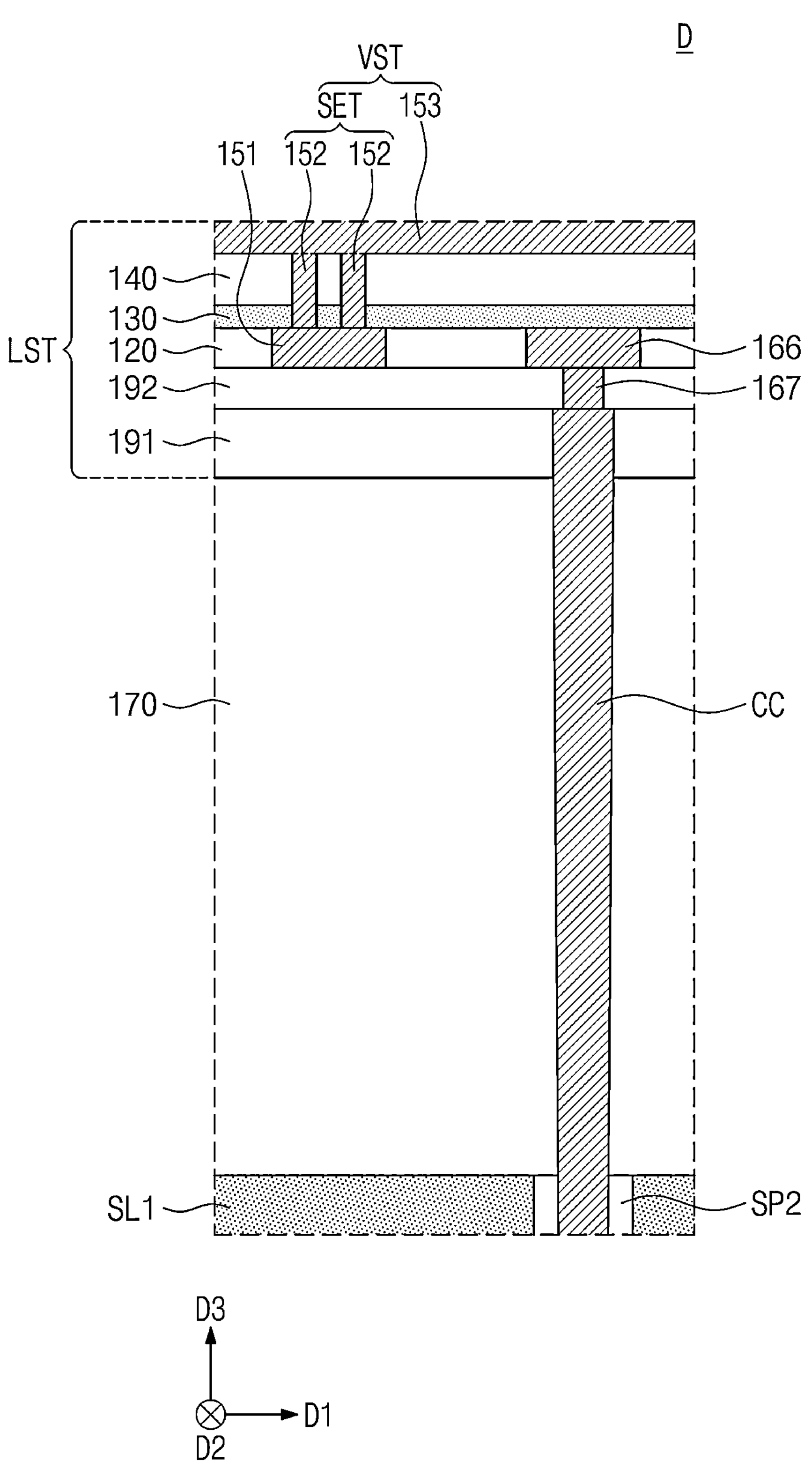
FIG. 2E is an enlarged sectional view illustrating a portion 'D' of FIG. 2B.
Figure 2F:
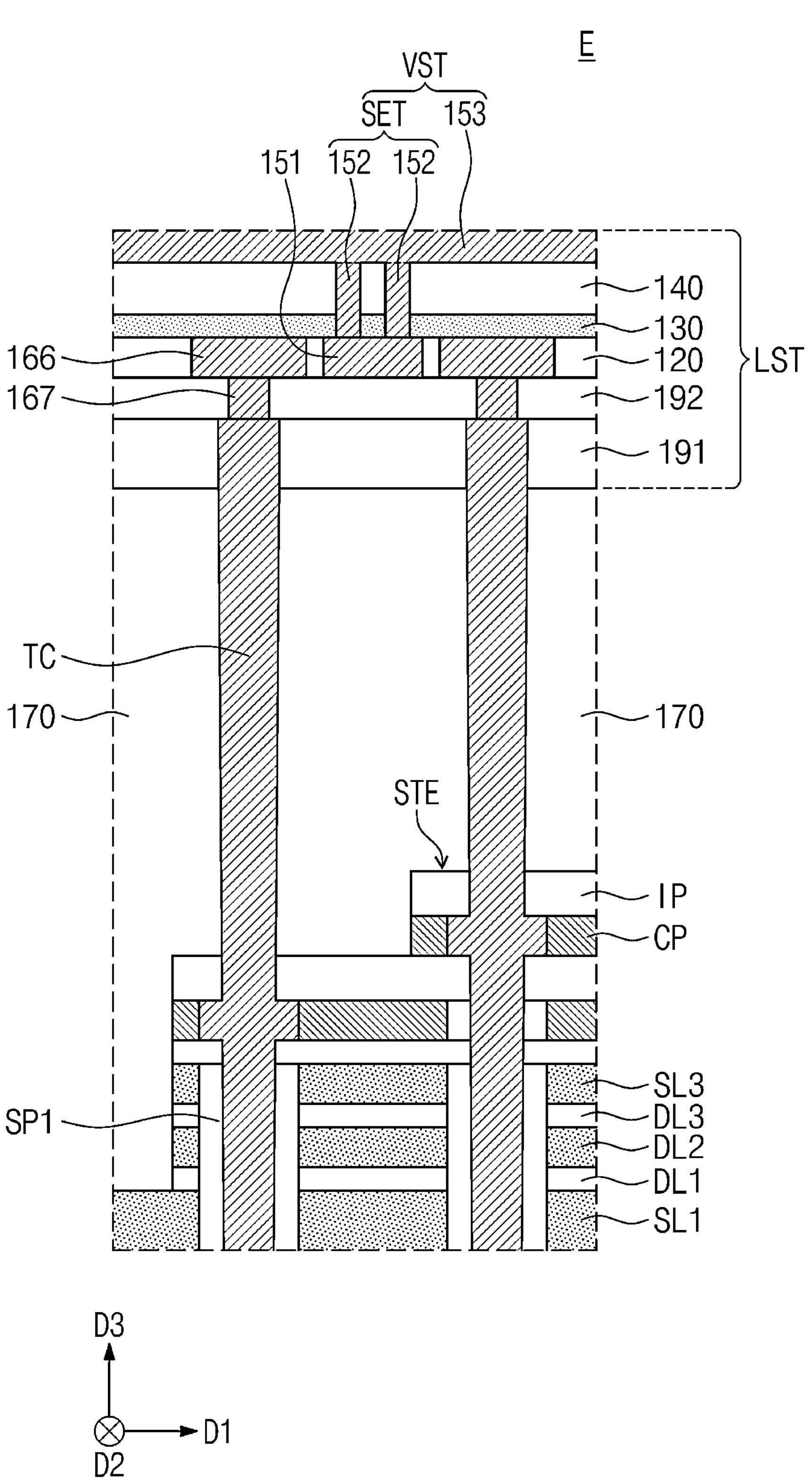
FIG. 2F is an enlarged sectional view illustrating a portion 'E' of FIG. 2B.

FIG. 2A is a plan view illustrating a semiconductor device according to an embodiment of the inventive concept. FIG. 2B is a sectional view taken along a line A-A' of FIG. 2A. FIG. 2C is an enlarged sectional view illustrating a portion 'B' of FIG. 2B. FIG. 2D is an enlarged sectional view illustrating a portion 'C' of FIG. 2B. FIG. 2E is an enlarged sectional view illustrating a portion 'D' of FIG. 2B. FIG. 2F is an enlarged sectional view illustrating a portion 'E' of FIG. 2B.

Referring to FIGS. 2A, 2B, 2C, 2D, 2E, and 2F, a semiconductor device may include a peripheral circuit structure PST, a source structure SST on the peripheral circuit structure PST, a first gate stack GST1, a second gate stack GST2, a first dummy stack DT1, and a second dummy stack DT2 on the source structure SST, a stepwise insulating layer 170 disposed on the first and second gate stacks GST1 and GST2 and the first and second dummy stacks DT1 and DT2, connection contacts CC, memory channel structures CS, penetration contacts TC, first source insulating patterns SP1, second source insulating pattern SP2, contact insulating patterns CIP, and an interconnection structure LST on the second gate stack GST2, the second dummy stack DT2, and the stepwise insulating layer 170.

The peripheral circuit structure PST may include a substrate 100. The substrate 100 may be a plate-shaped structure that may be parallel to a plane defined by a first direction D1 and a second direction D2. The first and second directions D1 and D2 may be non-parallel to each other. In an embodiment, the first and second directions D1 and D2 may be two different horizontal directions, which are orthogonal to each other. In an embodiment, the substrate 100 may be a semiconductor substrate. As an example, the substrate 100 may be formed of, or include silicon, germanium, silicon-germanium, GaP, or GaAs. In an embodiment, the substrate 100 may be a silicon-on-insulator (SOI) substrate or a germanium-on-insulator (GOI) substrate.

The peripheral circuit structure PST may further include a peripheral insulating layer 111, peripheral transistors 101, peripheral contacts 105, and peripheral conductive lines 107.

The peripheral insulating layer 111 may be provided on the substrate 100. The peripheral insulating layer 111 may be formed of, or include at least one insulating material. In an embodiment, the peripheral insulating layer 111 may be a multiple insulating layer. In an embodiment, the peripheral insulating layer 111 may be formed of, or include, at least one of an oxide material or a nitride material. The peripheral insulating layer 111 on the substrate 100 may be disposed on the peripheral transistors 101 and the peripheral conductive lines 107. The peripheral insulating layer 111 may enclose the peripheral transistors 101, the peripheral contacts 105, and the peripheral conductive lines 107.

The peripheral transistor 101 may be provided between the substrate 100 and the peripheral insulating layer 111. In an embodiment, the peripheral transistor 101 may include source/drain regions, a gate electrode, and a gate insulating layer. Device isolation layers 103 may be provided in the substrate 100. The peripheral transistor 101 may be disposed between the device isolation layers 103. The device isolation layer 103 may be formed of, or include at least one insulating material.

The peripheral contact 105 may be connected to the peripheral transistor 101 or the peripheral conductive line 107. The peripheral contact 105 and the peripheral conductive line 107 may be provided in the peripheral insulating layer 111. The peripheral conductive lines 107 may be electrically connected to the peripheral transistor 101 through the peripheral contacts 105. The peripheral contact 105 and the peripheral conductive line 107 may be formed of, or include at least one conductive material. In an embodiment, the peripheral contact 105 and the peripheral conductive line 107 may be formed of, or include at least one metallic material.

The source structure SST may be provided on the peripheral insulating layer 111. The source structure SST may include a dummy region DR, a cell region CR, and an extension region ER. The extension region ER may be provided between the dummy region DR and the cell region CR. The extension region ER may include a connection region NR and a stepwise region SR. The connection region NR may be disposed between the stepwise region SR and the dummy region DR. The cell region CR, the stepwise region SR, the connection region NR, and the dummy region DR may be distinct regions that are differentiated from each other in a plan view defined in the first and second directions D1 and D2. In an example, the connection region NR may be disposed between the stepwise region SR and the dummy region DR in the first direction D1. The stepwise region SR of the extension region ER may be adjacent to the dummy region DR, and the connection region NR of the extension region ER may be adjacent to the cell region CR.

The source structure SST may include a first source layer SL1, a second source layer SL2, and a third source layer SL3, a first dummy layer DL1, a second dummy layer DL2, and a third dummy layer DL3, a first dummy insulating layer DDL1, a second dummy insulating layer DDL2, and a third dummy insulating layer DDL3, and a dummy source layer DSL. The second source layer SL2 and the first dummy layer DL1 may be disposed on the first source layer SL1, the second dummy layer DL2 may be disposed on the first dummy layer DL1, the third dummy layer DL3 may be disposed on the second dummy layer DL2, and the third source layer SL3 may be disposed on the second source layer SL2 and the third dummy layer DL3. The first dummy insulating layer DDL1 may be disposed on the first source layer SL1, the second dummy insulating layer DDL2 may be disposed on the first dummy insulating layer DDL1, the third dummy insulating layer DDL3 may be disposed on the second dummy insulating layer DDL2, and the dummy source layer DSL may be disposed on the third dummy insulating layer DDL3.

The first source layer SL1 may extend in the first direction D1. A width of the first source layer SL1 in the first direction D1 may be larger than a width of the third source layer SL3 in the first direction D1. The first source layer SL1 may be disposed in the cell region CR, the extension region ER, and the dummy region DR.

The first to third source layers SL1, SL2, and SL3 may be formed of, or include at least one conductive material. As an example, the first to third source layers SL1, SL2, and SL3 may be formed of, or include poly silicon. The second source layer SL2 may be disposed in the cell region CR. The second source layer SL2 may be used as a common source line.

The first dummy layer DL1, the second dummy layer DL2, and the third dummy layer DL3 may be sequentially provided on the first source layer SL1 in a third direction D3. In an example, the first dummy layer DL1 may be disposed on the first source layer SL2, the second dummy layer DL2 may be disposed on the first dummy layer DL1, and the third dummy layer DL3 may be disposed on the second dummy layer DL2. The first to third dummy layers DL1, DL2, and DL3 may be disposed in the stepwise region SR. The first to third dummy layers DL1, DL2, and DL3 may be disposed at the same level as the second source layer SL2. The first to third dummy layers DL1, DL2, and DL3 may be formed of, or include at least one insulating material. In an embodiment, the first and third dummy layers DL1 and DL3 may be formed of, or include the same insulating material, and the second dummy layer DL2 may be formed of, or include an insulating material different from the first and third dummy layers DL1 and DL3. As an example, the second dummy layer DL2 may be formed of, or include nitride, and the first and third dummy layers DL1 and DL3 may be formed of, or include oxide.

The third source layer SL3 may be disposed on the second source layer SL2 and the first to third dummy layers DL1, DL2, and DL3. The third source layer SL3 may be disposed in the cell region CR and the stepwise region SR.

The source structure SST may further include the first source insulating patterns SP1 and the second source insulating pattern SP2. The first and second source insulating patterns SP1 and SP2 may be disposed in the extension region ER. The first source insulating patterns SP1 may be disposed in the stepwise region SR. The second source insulating pattern SP2 may be disposed in the connection region NR. The first source insulating pattern SP1 may enclose the penetration contact TC. The second source insulating pattern SP2 may enclose the connection contact CC.

The first source insulating pattern SP1 may penetrate the third source layer SL3, the first to third dummy layers DL1, DL2, and DL3, and the first source layer SL1. The first source insulating pattern SP1 may be enclosed by the third source layer SL3, the first to third dummy layers DL1, DL2, and DL3, and the first source layer SL1. The second source insulating pattern SP2 may penetrate the first source layer SL1. The second source insulating pattern SP2 may be enclosed by the first source layer SL1. The first and second source insulating patterns SP1 and SP2 may be formed of, or include at least one insulating material. In an embodiment, the first and second source insulating patterns SP1 and SP2 may be formed of, or include at least one oxide material.

The first and second gate stacks GST1 and GST2 may include insulating patterns IP and conductive patterns CP, which may be alternatively stacked in the third direction D3. The conductive patterns CP may correspond to the word lines WL, the first and second gate lower lines LL1 and LL2, and the first and second gate upper lines UL1 and UL2 of FIG. 1A.

The first gate stack GST1 may be disposed on the source structure SST. The second gate stack GST2 may be disposed on the first gate stack GST1. The first and second gate stacks GST1 and GST2 may be disposed on the cell region CR and the extension region ER. The number of the gate stacks GST1 and GST2 may not be limited to that in the illustrated example. In an embodiment, the number of the gate stacks GST1 and GST2 may be greater than three.

A staircase structure STE of the first and second gate stacks GST1 and GST2 may be defined by the insulating patterns IP and the conductive patterns CP of the first and second gate stacks GST1 and GST2.

The insulating patterns IP may be formed of, or include at least one insulating material. As an example, the insulating patterns IP may be formed of, or include at least one oxide material. The conductive patterns CP may be formed of, or include at least one conductive material. As an example, the conductive patterns CP may be formed of, or include tungsten.

Each of the first and second gate stacks GST1 and GST2 may further include contact insulating patterns CIP. The contact insulating pattern CIP may be disposed at the same level as the conductive pattern CP of the first gate stack GST1 or the conductive pattern CP of the second gate stack GST2. The contact insulating pattern CIP may enclose the penetration contact TC. The contact insulating pattern CIP may be disposed between the penetration contact TC and the conductive pattern CP of the first gate stack GST1 or between the penetration contact TC and the conductive pattern CP of the second gate stack GST2. The contact insulating pattern CIP may be formed of, or include at least one insulating material. As an example, the contact insulating pattern CIP may be formed of, or include at least one oxide material.

On the cell region CR, the memory channel structures CS may penetrate the first and second gate stacks GST1 and GST2. The memory channel structures CS may extend in the third direction D3 and penetrate the first gate stack GST1, the second gate stack GST2, the second source layer SL2, and the third source layer SL3. A bottom surface of each of the memory channel structures CS may be located at a level lower than a top surface of the first source layer SL1.

Each of the memory channel structures CS may include an insulating capping layer 189, a channel layer 187 enclosing the insulating capping layer 189, and a memory layer 183 enclosing the channel layer 187.

The insulating capping layer 189 may be formed of, or include at least one insulating material. As an example, the insulating capping layer 189 may be formed of, or include at least one oxide material. The channel layer 187 may be formed of, or include at least one conductive material. As an example, the channel layer 187 may be formed of, or include poly silicon. The channel layer 187 may be electrically connected to the second source layer SL2. The second source layer SL2 may penetrate the memory layer 183 and may be connected to the channel layer 187.

The memory layer 183 may be configured to store data. In an embodiment, the memory layer 183 may include a tunnel insulating layer enclosing the channel layer 187, a data storing layer enclosing the tunnel insulating layer, and a blocking layer enclosing the data storing layer.

The penetration contact TC may penetrate a first cover insulating layer 191, the stepwise insulating layer 170, the first source layer SL1, the third source layer SL3, the first dummy layer DL1, the second dummy layer DL2, the third dummy layer DL3, the first source insulating pattern SP1, and the peripheral insulating layer 111. The penetration contact TC may be connected to the conductive pattern CP. The penetration contact TC may be disposed in the extension region ER. The penetration contact TC may penetrate at least one of the insulating patterns IP. The penetration contact TC may be electrically connected to the peripheral conductive line 107. The penetration contact TC may be formed of, or include at least one conductive material.

The first dummy insulating layer DDL1 may be disposed on the first source layer SL1, the second dummy insulating layer DDL2 may be disposed on the first dummy insulating layer DDL1, the third dummy insulating layer DDL3 may be disposed on the second dummy insulating layer DDL2, and the dummy source layer DSL may be disposed on the third dummy insulating layer DDL3.

The dummy source layer DSL may be located at the same level as the third source layer SL3, and each of the first to third dummy insulating layers DDL1, DDL2, and DDL3 may be located at the same level as a corresponding one of the first to third dummy layers DL1, DL2, and DL3. The dummy source layer DSL and the first to third dummy insulating layers DDL1, DDL2, and DDL3 may be disposed in the dummy region DR.

The dummy source layer DSL may be formed of, or include at least one conductive material. As an example, the dummy source layer DSL may be formed of, or include poly silicon. The first to third dummy insulating layers DDL1, DDL2, and DDL3 may be formed of or include at least one of insulating materials. In an embodiment, the first and third dummy insulating layers DDL1 and DDL3 may be formed of, or include the same insulating material, and the second dummy insulating layer DDL2 may be formed of, or include an insulating material different from the first and third dummy insulating layers DDL1 and DDL3. As an example, the second dummy insulating layer DDL2 may be formed of, or include at least one nitride material, and the first and third dummy insulating layers DDL1 and DDL3 may be formed of, or include at least one oxide material.

The first dummy stack DT1 may be provided on the source structure SST. The second dummy stack DT2 may be provided on the first dummy stack DT1. The first and second dummy stacks DT1 and DT2 may be provided on the dummy region DR. The number of the dummy stacks DT1 and DT2 may not be limited to that in the illustrated example. In an embodiment, the number of the dummy stacks DT1 and DT2 may be greater than three.

The first and second dummy stacks DT1 and DT2 may include first dummy insulating patterns DIP1 and second dummy insulating patterns DIP2. The first dummy insulating pattern DIP1 and the second dummy insulating pattern DIP2 may be alternatively stacked in the third direction D3.

A dummy staircase structure DTE of the first and second dummy stacks DT1 and DT2 may be defined by the first and second dummy insulating patterns DIP1 and DIP2 of the first and second dummy stacks DT1 and DT2.

The first and second dummy insulating patterns DIP1 and DIP2 may be formed of, or include at least one insulating material. As an example, the first dummy insulating pattern DIP1 may be formed of, or include at least one oxide material. As an example, the second dummy insulating pattern DIP2 may be formed of, or include at least one nitride material.

The stepwise insulating layer 170 may be provided in the extension region ER and the dummy region DR. The stepwise insulating layer 170 may be disposed on the first and second gate stacks GST1 and GST2, the first and second dummy stacks DT1 and DT2, and a portion of the first source layer SL1. The stepwise insulating layer 170 may be disposed on the staircase structures STE of the first and second gate stacks GST1 and GST2 in the stepwise region SR. The stepwise insulating layer 170 may enclose the penetration contacts TC in the stepwise region SR. The stepwise insulating layer 170 may be disposed on the top surface of the first source layer SL1 in the connection region NR. The stepwise insulating layer 170 may enclose the connection contact CC, on the connection region NR. The stepwise insulating layer 170 may be disposed on the dummy staircase structures DTE of the first and second dummy stacks DT1 and DT2 in the dummy region DR.

The stepwise insulating layer 170 may be formed of, or include at least one insulating material. As an example, the stepwise insulating layer 170 may be formed of, or include at least one oxide material. In an embodiment, the stepwise insulating layer 170 may include a plurality of insulating layers.

The penetration contacts TC may be electrically connected to respective ones of the conductive patterns CP. For example, a penetration contact TC may include a portion extending in the first direction D1 and contacting a respective conductive pattern CP. The contact insulating patterns CIP may be formed adjacent to the penetration contact TC at the conductive patterns CP other than the respective conductive pattern CP electrically connected to the penetration contact TC.

The connection contact CC may penetrate the first cover insulating layer 191, the stepwise insulating layer 170, the first source layer SL1, the second source insulating pattern SP2, and the peripheral insulating layer 111 and may be electrically connected to the peripheral transistor 101 of the peripheral circuit structure PST. The connection contact CC may be provided on the connection region NR. The connection contact CC may be spaced apart from the first gate stack GST1 and the second gate stack GST2. The connection contact CC may be spaced apart from the first source layer SL1 by the second source insulating pattern SP2. The connection contact CC may be formed of, or include at least one conductive material.

The interconnection structure LST may be disposed on the second gate stack GST2, the second dummy stack DT2, and the stepwise insulating layer 170. The interconnection structure LST may be disposed on the cell region CR, the extension region ER, and the dummy region DR. The interconnection structure LST may include a first cover insulating layer 191, a second cover insulating layer 192 on the first cover insulating layer 191, a first interconnection insulating layer 120 on the second cover insulating layer 192, a capping layer 130 on the first interconnection insulating layer 120, a second interconnection insulating layer 140 on the capping layer 130, and a via structure VST on the second interconnection insulating layer 140. The via structure VST may penetrate the second interconnection insulating layer 140 and the capping layer 130.

The first cover insulating layer 191 may extend in the first direction D1. The first cover insulating layer 191 may be disposed on the second gate stack GST2, the second dummy stack DT2, and the stepwise insulating layer 170. The first cover insulating layer 191 may be disposed on a top surface of the second gate stack GST2, a top surface of the second dummy stack DT2, and a top surface of the stepwise insulating layer 170.

The interconnection structure LST may further include first contacts 163 in the first cover insulating layer 191. The first contacts 163 may be disposed on the cell region CR. The first contact 163 may connect a second contact 162, to the memory channel structure CS. The first cover insulating layer 191 may be formed of, or include at least one insulating material. The first contact 163 may be formed of, or include at least one conductive material.

The second cover insulating layer 192 may extend in the first direction D1. The second cover insulating layer 192 may be disposed on a top surface of the first cover insulating layer 191.

The interconnection structure LST may further include second contacts 162 in the second cover insulating layer 192. The second contacts 162 may be disposed on the cell region CR. The second contact 162 may connect a bit line 161, to the first contact 163.

The interconnection structure LST may further include third contacts 167 in the second cover insulating layer 192. The third contacts 167 may be disposed on the extension region ER. The third contact 167 may connect a first conductive line 166 to the penetration contact TC or the connection contact CC. The third contact 167 may electrically connect a first conductive line 166 to the penetration contact TC or the connection contact CC. The second contact 162 and the third contact 167 may be located at the same level. The second cover insulating layer 192 may be formed of, or include at least one insulating material. The second contact 162 and the third contact 167 may be formed of, or include at least one conductive material.

The first interconnection insulating layer 120 may extend in the first direction D1. The first interconnection insulating layer 120 may be disposed on a top surface of the second cover insulating layer 192.

The interconnection structure LST may further include bit lines 161 in the first interconnection insulating layer 120. The bit lines 161 may be disposed on the cell region CR. The bit lines 161 may be electrically connected to the memory channel structure CS through the first contact 163 and the second contact 162.

The interconnection structure LST may further include first conductive lines 166 and lower conductive patterns 151, which are provided in the first interconnection insulating layer 120. The first conductive lines 166 may be disposed on the extension region ER. The lower conductive patterns 151 may be disposed on the extension region ER and the dummy region DR. The first conductive line 166 may be electrically connected to the penetration contact TC through the third contact 167.

The interconnection structure LST may further include second conductive lines 168 in the first interconnection insulating layer 120. The second conductive lines 168 may be disposed on the dummy region DR.

The interconnection structure LST may further include lower dummy patterns 201 in the first interconnection insulating layer 120. The lower dummy patterns 201 may be disposed on the dummy region DR.

The lower conductive patterns 151, the first conductive lines 166, the second conductive lines 168, the lower dummy patterns 201, and the bit lines 161 may be located at the same level. The first interconnection insulating layer 120 may be formed of, or include at least one insulating material. The bit line 161, the first conductive line 166, the second conductive line 168, the lower dummy pattern 201, and the lower conductive pattern 151 may be formed of, or include at least one conductive material. As an example, the bit line 161, the first conductive line 166, the second conductive line 168, the lower dummy pattern 201, and the lower conductive pattern 151 may be formed of, or include copper (Cu).

The capping layer 130 may extend in the first direction D1. The capping layer 130 may enclose one or more of vias 152. The capping layer 130 may be disposed on a top surface of the first interconnection insulating layer 120. The capping layer 130 may be formed of, or include at least one insulating material. As an example, the capping layer 130 may be formed of, or include silicon nitride (SiN).

The second interconnection insulating layer 140 may extend in the first direction D1. The second interconnection insulating layer 140 may cover a top surface of the capping layer 130. The second interconnection insulating layer 140 may enclose the via structures VST. The second interconnection insulating layer 140 may be formed of, or include at least one insulating material.

The via structure VST may include via sets SET and an upper conductive pattern 153, which may be connected to each other.

The via set SET may include a plurality of vias 152. As an example, the via set SET may include two vias 152. The plurality of vias 152 of the via set SET may penetrate the second interconnection insulating layer 140 and the capping layer 130. The vias 152 of the via set SET may be disposed between a lower conductive pattern 151 and an upper conductive pattern 153. In an example, the vias 152 of the via set SET may connect one lower conductive pattern 151 to one upper conductive pattern 153. A width of the upper conductive pattern 153 may be larger than a width of the lower conductive pattern 151. The vias 152 may penetrate the capping layer 130. The vias 152 and the upper conductive pattern 153 may be formed of, or include at least one conductive material. As an example, the vias 152 and the upper conductive pattern 153 may be formed of, or include copper (Cu).

The via structure VST may include a via set SET in the extension region ER, and a via set SET in the dummy region DR. The via set SET in the extension region ER, may include a plurality of vias 152 in the extension region ER. The via set SET in the dummy region DR, may include a plurality of vias 152 in the dummy region DR.

The via sets SET may overlap the stepwise region SR or overlap the connection region NR. For example, the via sets SET may include a via set SET in the stepwise region SR, and a different via set SET in the connection region NR. The via set SET in the stepwise region SR may include a plurality of vias 152 in the stepwise region SR. The via set SET in the connection region NR may include a plurality of vias 152 in the connection region NR.

The via set SET in the stepwise region SR may overlap the staircase structure STE. In the connection region NR, a top surface of the first source layer SL1 may be in contact with a bottom surface of the stepwise insulating layer 170.

The via sets SET in the dummy region DR may overlap the uppermost one of the first dummy insulating patterns DIP1 of the second dummy stack DT2. The via sets SET in the dummy region DR may overlap the dummy staircase structure DTE.

The lower conductive patterns 151 may be spaced apart from each other by the first interconnection insulating layer 120. The lower conductive patterns 151 may overlap the extension region ER or the dummy region DR.

In an example, the capping layer 130 may be substantially prevent the diffusion of hydrogen atoms. The capping layer 130 may be a hydrogen shielding layer. The vias 152 may be used as a transfer path for hydrogen atoms. The vias 152 may be used as a transfer path for hydrogen atoms past a hydrogen shielding layer. The hydrogen atoms, which may be transferred through the vias 152, may be supplied to the conductive patterns CP of the first and second gate stacks GST1 and GST2. The conductive patterns CP may include lattice defects. As an example, the conductive patterns CP may include a grain boundary type lattice defect. Lattice defects, such as grain boundaries, may affect the characteristics of the conductive patterns CP. For example, grain boundaries may decrease an electrical conductivity of the conductive patterns CP. The hydrogen atoms may diffuse into the conductive patterns CP through the vias 152 and between lattice defects therein. The hydrogenation of the conductive patterns CP may improve the electric characteristics of the semiconductor device.

The interconnection structure LST may further include a dummy via structure 200. The dummy via structure 200 may be spaced apart from the via structure VST with the second interconnection insulating layer 140 interposed therebetween. The dummy via structure 200 may be placed at the same level as the via structure VST. The dummy via structure 200 may include a dummy via set DET and an upper dummy pattern 203. The dummy via set DET may include a plurality of dummy vias 202. As an example, the dummy via set DET may include two dummy vias 202. The dummy vias 202 of the dummy via set DET may connect one lower dummy pattern 201 to one upper dummy pattern 203. The dummy vias 202 and the upper dummy pattern 203 may be formed of, or include at least one conductive material. As an example, the dummy vias 202 and the upper dummy pattern 203 may be formed of, or include copper (Cu).

FIG. 3, FIG. 4, FIG. 5, FIG. 6, and FIG. 7 are diagrams illustrating a method of fabricating a semiconductor device, according to an embodiment of the inventive concept. Each of the diagrams of FIG. 3, FIG. 4, FIG. 5, FIG. 6, and FIG. 7 corresponds to that of FIG. 2B.

Figure 3:
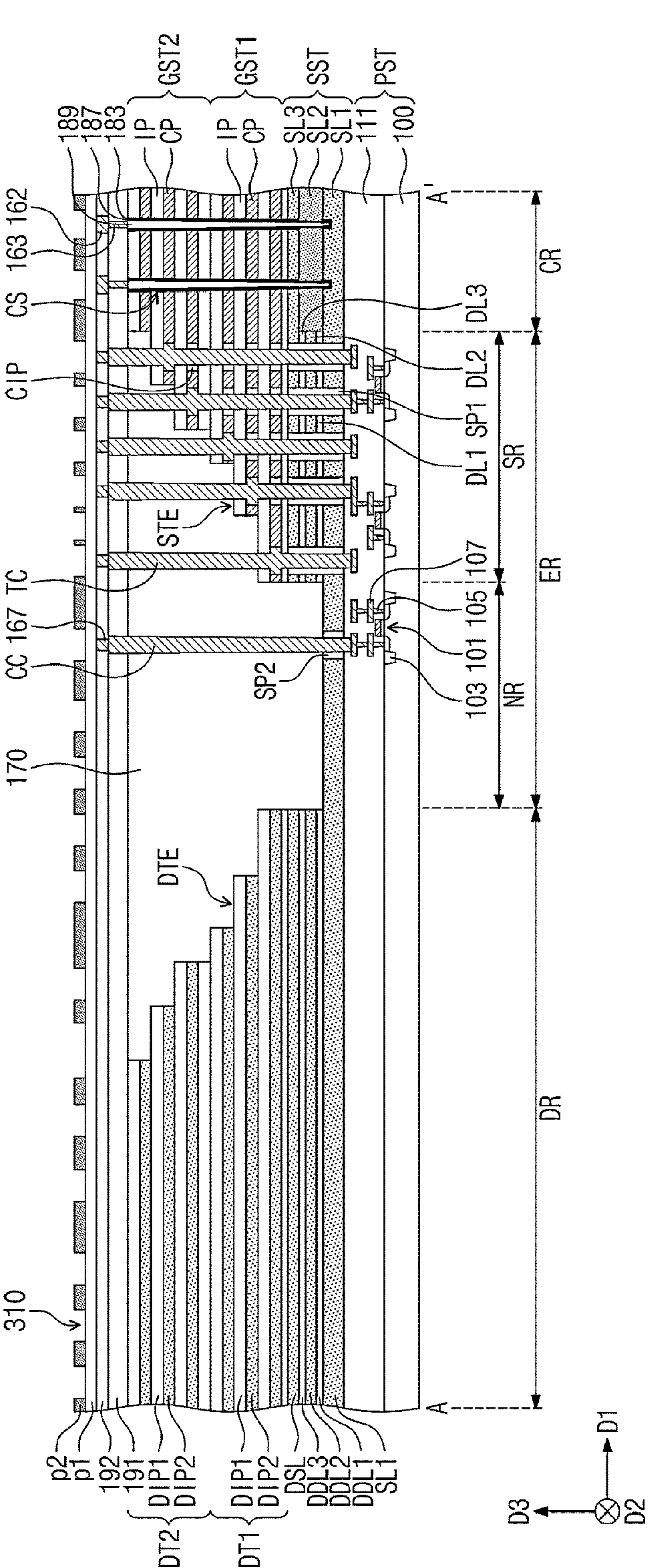
FIG. 3, FIG. 4, FIG. 5, FIG. 6, and FIG. 7 are diagrams illustrating a method of fabricating a semiconductor device, according to an embodiment of the inventive concept.

Referring to FIG. 3, the peripheral transistors 101, the device isolation layers 103, the peripheral contacts 105, the peripheral conductive lines 107, and the peripheral insulating layer 111 may be formed on the substrate 100.

The source structure SST may be formed. The first gate stack GST1, the second gate stack GST2, the first dummy stack DT1, the second dummy stack DT2, and the stepwise insulating layer 170 may be formed on the source structure SST. The memory channel structure CS may be formed. The first cover insulating layer 191 may be formed. The penetration contact TC and the connection contact CC may be formed.

The second cover insulating layer 192 may contact a top surface of the first cover insulating layer 191. A first preliminary interconnection insulating layer p1 may contact the top surface of the second cover insulating layer 192. A photoresist layer p2 may contact a top surface of the first preliminary interconnection insulating layer p1. The photoresist layer p2 may include an opening 310, which may expose the first preliminary interconnection insulating layer p1. The opening 310 of the photoresist layer p2 may be formed by a photolithography process.

Figure 4:
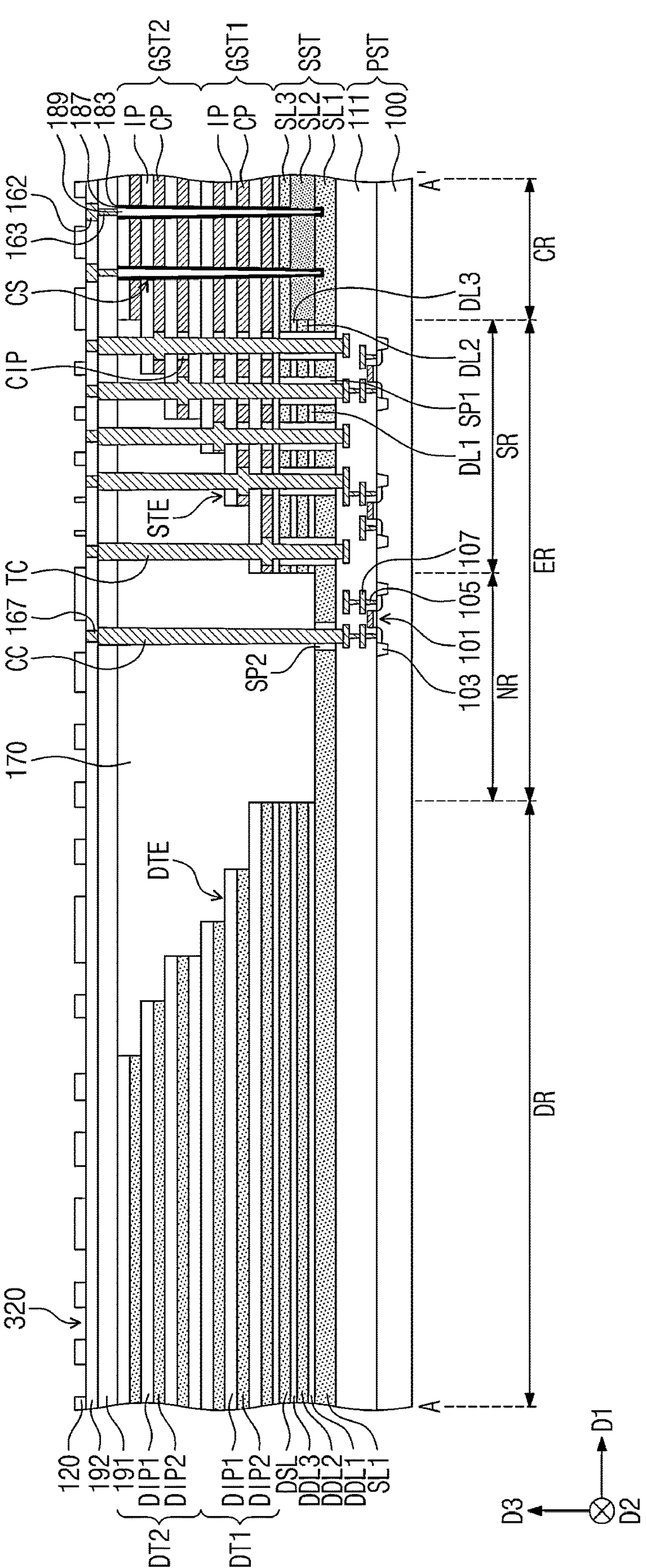

Referring to FIG. 4, the first preliminary interconnection insulating layer p1 may be etched using the photoresist layer p2 as an etch mask. A portion of the first preliminary interconnection insulating layer p1 exposed through the opening 310 of the photoresist layer p2 may be removed by an etching process. The first interconnection insulating layer 120 may be formed by a process of etching a portion of the first preliminary interconnection insulating layer p1. The first interconnection insulating layer 120 may include an opening 320 exposing a portion of the second cover insulating layer 192. The photoresist layer p2 may be removed.

Figure 5:
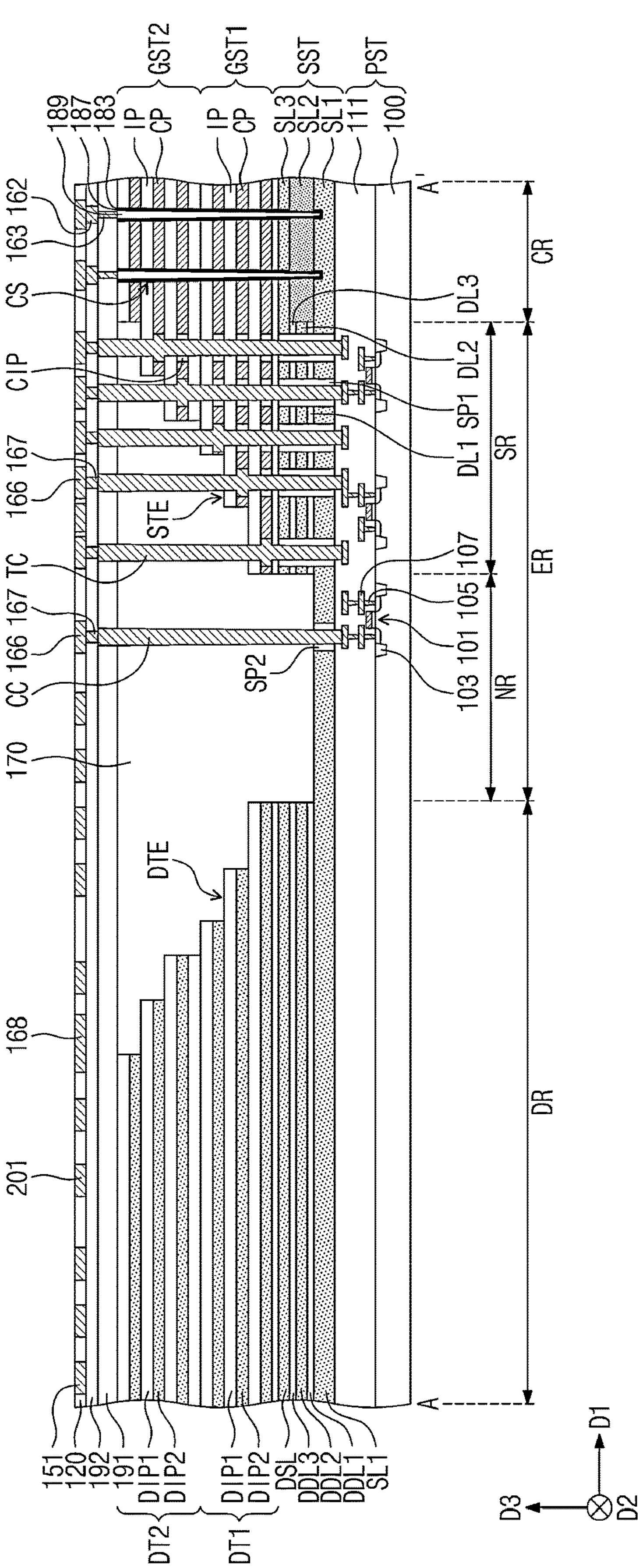

Referring to FIG. 5, the lower conductive patterns 151, the first conductive lines 166, the second conductive lines 168, the lower dummy patterns 201, and the bit lines 161 may be formed. In an embodiment, the formation of the lower conductive patterns 151, the first conductive lines 166, the second conductive lines 168, the lower dummy patterns 201, and the bit lines 161 may include filling the opening 320 of the first interconnection insulating layer 120 with a conductive material and performing a chemical mechanical polishing (CMP) process.

Figure 6:
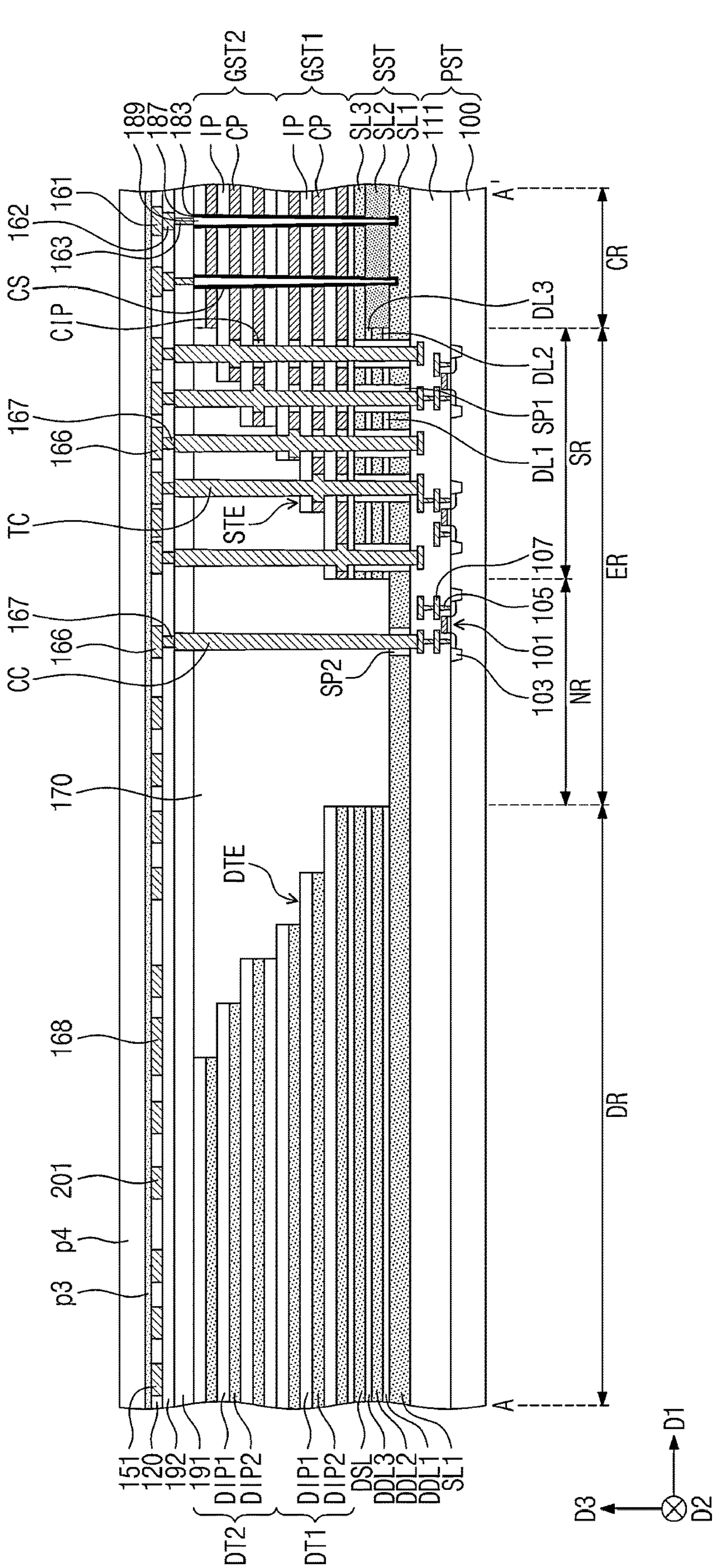

Referring to FIG. 6, a preliminary capping layer p3 may be formed on the top surface of the first interconnection insulating layer 120. A second preliminary interconnection insulating layer p4 may be formed on a top surface of the preliminary capping layer p3. The preliminary capping layer p3 and the second preliminary interconnection insulating layer p4 may be formed using a thin film deposition process.

Figure 7:
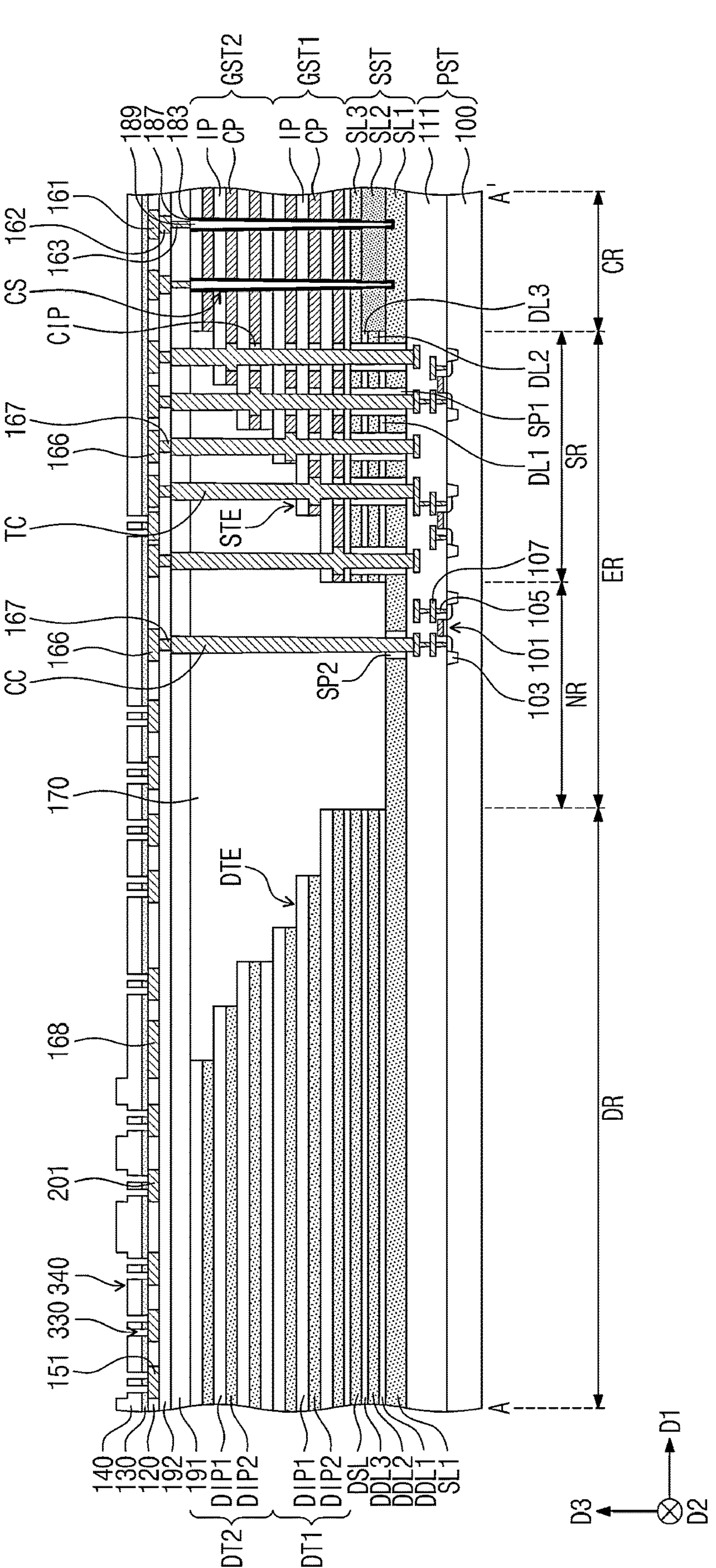

Referring to FIG. 7, via holes 330 and upper trenches 340 may be formed. The via holes 330 and the upper trenches 340 may be formed using a photolithography process and an etching process. The via holes 330 and the upper trenches 340 may be formed in the second interconnection insulating layer 140 and the capping layer 130 using a photolithography process and an etching process. The via holes 330 may penetrate the capping layer 130 and expose an upper surface of the lower conductive patterns 151.

Referring again to FIG. 2B, the vias 152, the upper conductive patterns 153, the dummy vias 202, and the upper dummy patterns 203 may be formed. The vias 152, the upper conductive patterns 153, the dummy vias 202, and the upper dummy patterns 203 may be formed by filling the via holes 330 and the upper trenches 340 with a conductive material. The vias 152, the upper conductive patterns 153, the dummy vias 202, and the upper dummy patterns 203 may be formed through a dual damascene process. The formation of the vias 152, the upper conductive patterns 153, the dummy vias 202, and the upper dummy patterns 203 may include performing a CMP process.

Figure 8:
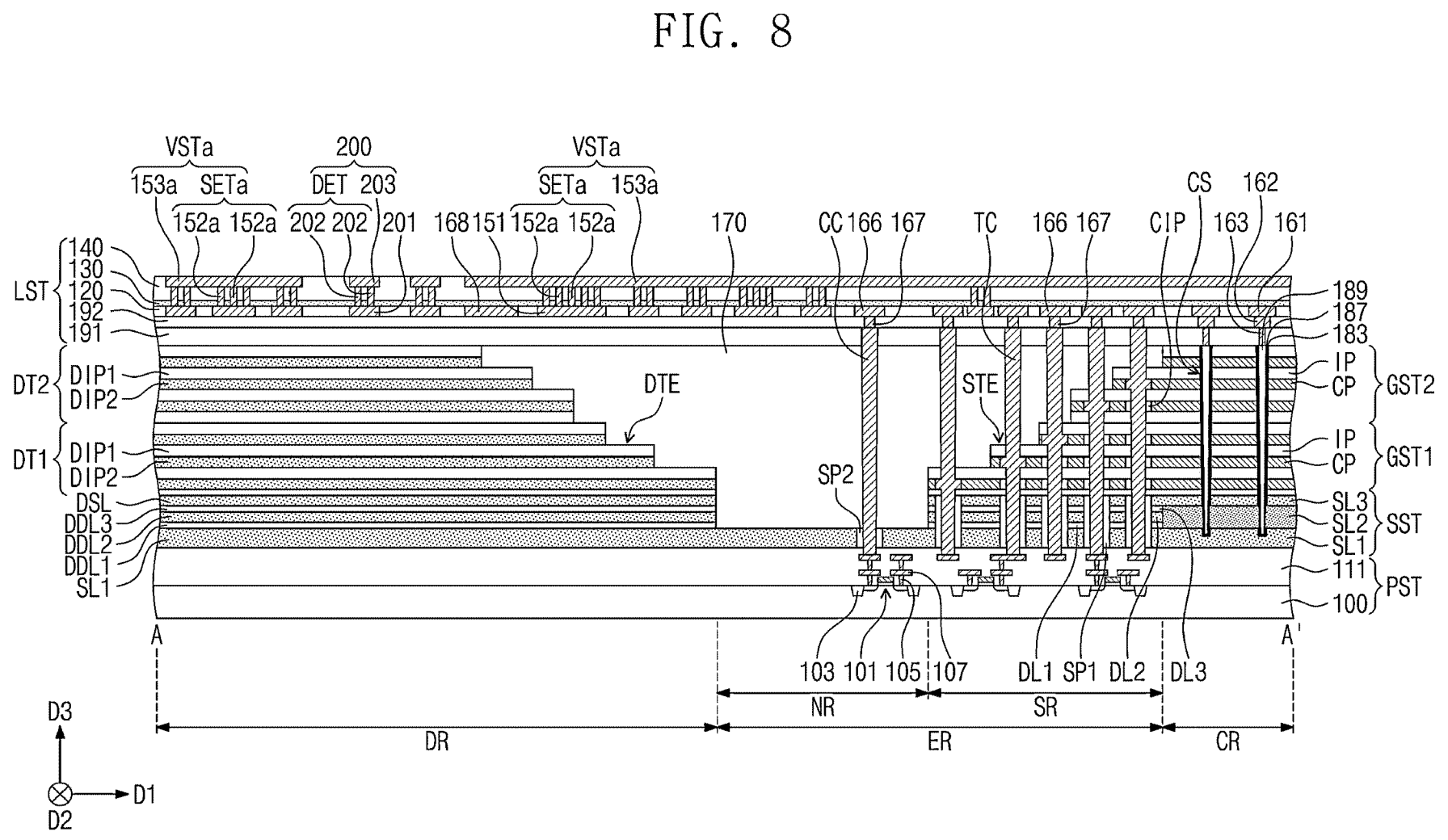

FIG. 8 is a plan view illustrating a three-dimensional semiconductor memory device, according to an embodiment of the inventive concept.

Referring to FIG. 8, a via structure VSTa of an interconnection structure LSTa may include a plurality of via sets SETa and an upper conductive pattern 153*a*. The via sets SETa may include a plurality of vias 152*a*. A via set SETa may include a plurality of vias 152*a* disposed on a lower conductive pattern 151. As an example, a first one of the via sets SETa may include five vias 152*a*, a second one of the via sets SETa may include three vias 152*a*, and a third one of the via sets SETa may include two vias 152*a*.

Figure 9:
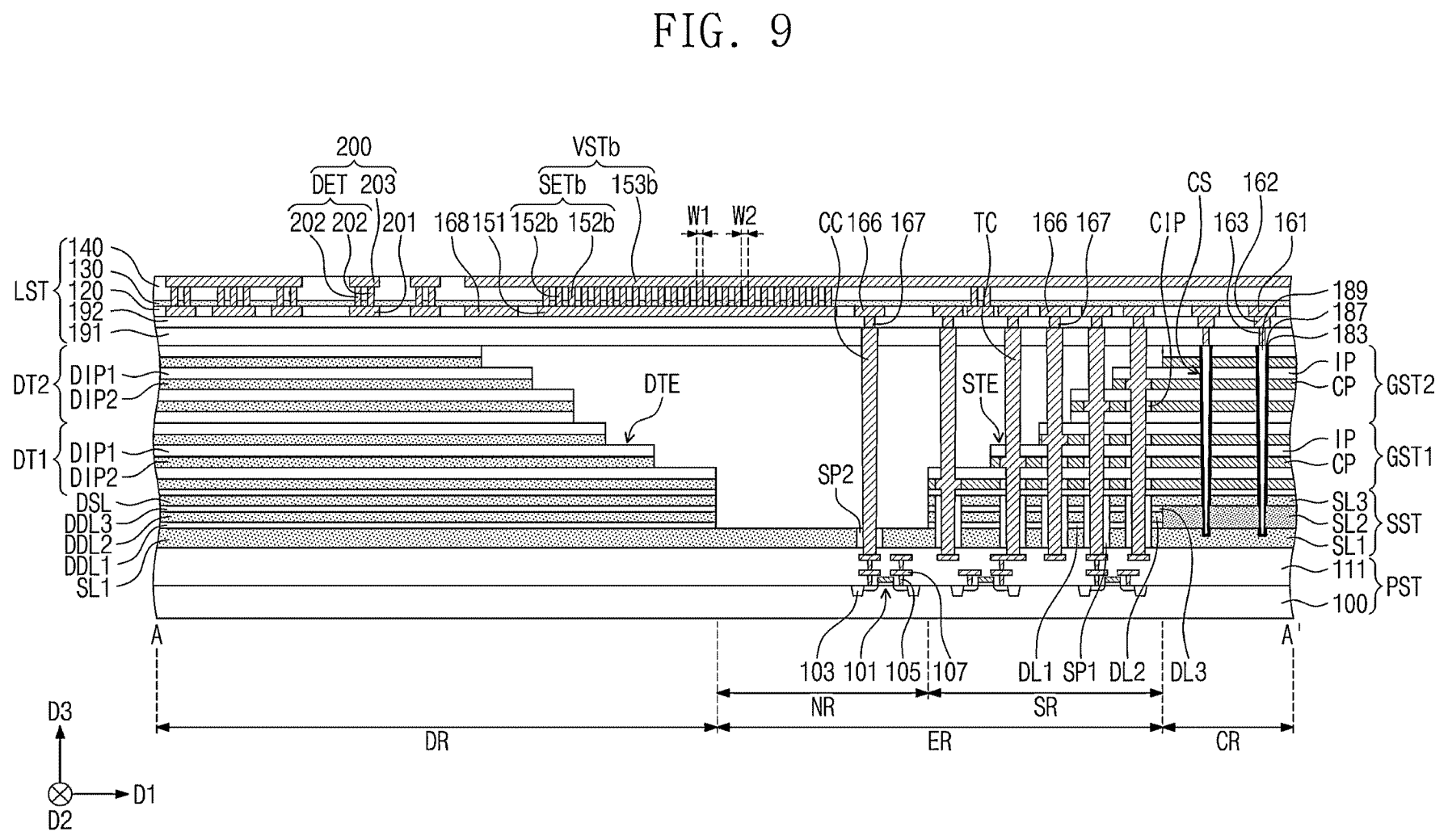

FIG. 9 is a sectional view illustrating a semiconductor device according to an embodiment of the inventive concept.

Referring to FIG. 9, a via structure VSTb of an interconnection structure LSTb may include a plurality of via sets SETb and an upper conductive pattern 153*b*. The via set SETb may include a plurality of vias 152*b* having a constant width W1. As an example, the width W1 of the via 152*b* may be about 126 nm or greater. A distance W2 between the vias 152*b* of the via set SETb may be constant. As an example, the distance W2 between the vias 152*b* may be about 124 nm or greater.

In a semiconductor device according to an embodiment of the inventive concept, vias may penetrate a capping layer and connect an upper conductive pattern to a lower conductive pattern, and here, the vias may be used as a transfer path for hydrogen atoms. Thus, the hydrogen atoms may be provided to a region between lattice defects, which may be formed in a conductive pattern of a gate stack, and may improve the electric characteristics of the semiconductor device.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:

a source structure including a cell region and an extension region adjacent to the cell region;

a gate stack in the cell region and the extension region;

a penetration contact disposed in the extension region;

a stepwise insulating layer disposed on the gate stack; and an interconnection structure on the stepwise insulating layer, wherein the interconnection structure comprises a first interconnection insulating layer, a first lower conductive pattern in the first interconnection insulating layer, a capping layer on the first interconnection insulating layer, and a via structure penetrating the capping layer, the via structure comprises a plurality of first vias connected to the first lower conductive pattern and connected to an upper conductive pattern, and the plurality of first vias are disposed in the extension region.

2. The semiconductor device of claim 1, wherein the first lower conductive pattern, the upper conductive pattern, and the plurality of first vias comprise copper (Cu).

3. The semiconductor device of claim 1, wherein the interconnection structure comprises a second interconnection insulating layer on the capping layer, the upper conductive pattern is formed in the second interconnection insulating layer, and the via structure is disposed in the second interconnection insulating layer and the capping layer.

4. The semiconductor device of claim 1, wherein the gate stack comprises conductive patterns, insulating patterns, and a staircase structure defined by the conductive patterns and the insulating patterns, and the plurality of first vias overlap the staircase structure in the extension region.

5. The semiconductor device of claim 1, wherein the extension region comprises a stepwise region and a connection region, the penetration contact is disposed in the stepwise region and a connection contact is disposed in the connection region, the source structure further comprises a first source layer disposed in the connection region, a top surface of the first source layer in contact with a bottom surface of the stepwise insulating layer, and the plurality of first vias are overlap the connection region.

6. The semiconductor device of claim 1, further comprising a bit line electrically connected to a memory channel structure, wherein the first lower conductive pattern and the bit line are disposed at a same level.

7. The semiconductor device of claim 1, wherein a width of the upper conductive pattern is larger than a width of the first lower conductive pattern.

8. The semiconductor device of claim 1, further comprising a second lower conductive pattern in the first interconnection insulating layer, wherein the via structure further comprises a plurality of second vias, which are connected between the second lower conductive pattern and the upper conductive pattern, and the second vias are overlap the extension region.

9. The semiconductor device of claim 1, wherein the plurality of first vias are spaced apart from each other by a distance.

10. A semiconductor device, comprising:

a source structure including a cell region, a dummy region, and an extension region between the cell region and the dummy region;

a gate stack in the cell region and the extension region;

a dummy stack in the dummy region;

a stepwise insulating layer disposed on the gate stack and the dummy stack; and an interconnection structure on the stepwise insulating layer, wherein the interconnection structure comprises a first interconnection insulating layer, a first lower conductive pattern in the first interconnection insulating layer, a capping layer on the first interconnection insulating layer, a second interconnection insulating layer on the capping layer, and a via structure penetrating the second interconnection insulating layer, the via structure comprises a plurality of first vias in the dummy region and connected between the first lower conductive pattern and an upper conductive pattern, and the dummy stack comprises first dummy insulating patterns and second dummy insulating patterns, which are alternatively stacked.

11. The semiconductor device of claim 10, wherein the first lower conductive pattern, the upper conductive pattern, and the plurality of first vias comprise copper (Cu).

12. The semiconductor device of claim 10, further comprising a second lower conductive pattern in the extension region, wherein the via structure further comprises a plurality of second vias, which are connected to the second lower conductive pattern and the upper conductive pattern.

13. The semiconductor device of claim 10, wherein the plurality of first vias overlap an uppermost one of the first dummy insulating patterns.

14. The semiconductor device of claim 10, wherein the dummy stack comprises a dummy staircase structure defined by the first dummy insulating patterns and the second dummy insulating patterns, and the plurality of first vias overlap the dummy staircase structure.

15. The semiconductor device of claim 10, wherein a width of the upper conductive pattern is larger than a width of the first lower conductive pattern.

16. The semiconductor device of claim 10, further comprising a second lower conductive pattern in the dummy region, wherein the via structure further comprises a plurality of second vias connected between the second lower conductive pattern and the upper conductive pattern.

17. The semiconductor device of claim 10, wherein the via structure comprises three of the plurality of first vias.

18. An electronic system, comprising:

a substrate;

a semiconductor device on the substrate; and a controller provided on the substrate and electrically connected to the semiconductor device, wherein the semiconductor device comprises:

an insulating layer on the substrate;

a peripheral transistor disposed between the substrate and the insulating layer;

a source structure on the insulating layer, the source structure comprising a cell region, a dummy region, and an extension region between the cell region and the dummy region;

a gate stack in the cell region and the extension region;

a dummy stack in the dummy region;

a memory channel structure penetrating the gate stack;

a penetration contact and a connection contact disposed in the extension region;

a stepwise insulating layer disposed on the gate stack and the dummy stack; and an interconnection structure on the stepwise insulating layer, wherein the dummy stack comprises first dummy insulating patterns and second dummy insulating patterns, which are alternatively stacked, the interconnection structure comprises a first interconnection insulating layer, a first lower conductive pattern in the first interconnection insulating layer, a second lower conductive pattern in the first interconnection insulating layer, a capping layer on the first interconnection insulating layer, a second interconnection insulating layer on the capping layer, and a via structure penetrating the second interconnection insulating layer and the capping layer, the via structure comprises a plurality of first vias connected to the first lower conductive pattern and an upper conductive pattern, and a plurality of second vias connected to the second lower conductive pattern and the upper conductive pattern, the first lower conductive pattern and the plurality of first vias are in the extension region, and the second lower conductive pattern and the plurality of second vias are in the dummy region.

19. The electronic system of claim 18, wherein the gate stack comprises conductive patterns, insulating patterns, and a staircase structure defined by the conductive patterns and the insulating patterns, and the first lower conductive pattern and the plurality of first vias overlap the staircase structure.

20. The electronic system of claim 18, wherein the dummy stack further comprises a dummy staircase structure defined by the first dummy insulating patterns and the second dummy insulating patterns, and the second lower conductive pattern and the plurality of second vias overlap the dummy staircase structure.

* * * * *